US012654673B2

(12) United States Patent　　　　(10) Patent No.: US 12,654,673 B2
Eifert et al.　　　　　　　　　　　　(45) Date of Patent: Jun. 16, 2026

(54) BATTERY ISSUE IDENTIFICATION AND CONFIDENCE-LEVEL BASED REMEDIAL ACTION

(71) Applicant: Ford Global Technologies, LLC, Dearborn, MI (US)

(72) Inventors: Mark Eifert, Park Ridge, IL (US); Pankaj Kumar, Canton, MI (US); Matthew Loiselle, LaSalle, MI (US); Timothy Rampiaray, Southfield, MI (US)

(73) Assignee: FORD GLOBAL TECHNOLOGIES. LLC, Dearborn, MI (US)

( * ) Notice: Subject to any disclaimer, the term of this patent is extended or adjusted under 35 U.S.C. 154(b) by 886 days.

(21) Appl. No.: 17/585,756

(22) Filed: Jan. 27, 2022

(65) Prior Publication Data

US 2023/0234550 A1　　Jul. 27, 2023

(51) Int. Cl.
B60W 10/26 (2006.01)
G01R 31/367 (2019.01)
(Continued)

(52) U.S. Cl.
CPC ........... B60W 10/26 (2013.01); G01R 31/367 (2019.01); B60R 16/033 (2013.01); B60W 2400/00 (2013.01); B60W 2510/244 (2013.01); B60W 2510/248 (2013.01); G01R 31/392 (2019.01); H02J 7/80 (2026.01); H02J 7/855 (2026.01)

(58) Field of Classification Search
CPC ............. B60W 10/26; B60W 2400/00; B60W 2510/244; B60W 2510/248; B60R 16/033; B60R 16/0232; G01R 31/367; G01R 31/392; H02J 7/0047; H02J 7/0063; H02J 1/14; H02J 7/80; H02J 7/855

See application file for complete search history.

(56) References Cited

U.S. PATENT DOCUMENTS

| | | | |
|---|---|---|---|
| 4,742,476 A | 5/1988 | Schwartz et al. | |
| 2002/0084769 A1* | 7/2002 | Iritani | B60H 1/3208 |
| | | | 903/903 |

(Continued)

FOREIGN PATENT DOCUMENTS

CN　　　　106168799 A　　11/2016

OTHER PUBLICATIONS

Shan Zhu et al., "Predicting Battery Life With Early Cyclic Data by Machine Learning", wileyonlinelibrary.com/journal/est2, 2019, John Wiley & Sons, Ltd., 5 pgs.

(Continued)

*Primary Examiner* — Anne Marie Antonucci
(74) *Attorney, Agent, or Firm* — Frank Lollo; Brooks Kushman P.C.

(57) ABSTRACT

Responsive to data being indicative of conditions that will decrease a life of a battery to the extent the life expectancy will be less than a target value with a confidence that exceeds a first threshold, a processor may generate an alert or mitigation recommendations. Responsive to data being indicative of the cause of conditions that result in the life expectancy to be less than a target value with a confidence that exceeds a second threshold, the processor may implement a control strategy or set of control strategies to benefit the life expectancy of the battery.

20 Claims, 17 Drawing Sheets

(51) Int. Cl.

| | |
|---|---|
| *B60R 16/033* | (2006.01) |
| *G01R 31/392* | (2019.01) |
| *H02J 7/00* | (2006.01) |
| *H02J 7/80* | (2026.01) |

(56) References Cited

U.S. PATENT DOCUMENTS

| | | | |
|---|---|---|---|
| 2007/0028220 A1 | 2/2007 | Miller et al. | |
| 2007/0239374 A1* | 10/2007 | Dougherty | G01R 31/392 |
| | | | 702/63 |
| 2012/0029747 A1* | 2/2012 | Katoh | B60R 16/03 |
| | | | 701/22 |
| 2013/0020398 A1* | 1/2013 | Goto | B60L 1/02 |
| | | | 165/41 |
| 2014/0159670 A1* | 6/2014 | Lee | B60L 3/0007 |
| | | | 320/128 |
| 2015/0291036 A1* | 10/2015 | Ryu | B60L 1/00 |
| | | | 701/22 |
| 2015/0317148 A1* | 11/2015 | Ohashi | G06F 8/71 |
| | | | 717/170 |
| 2017/0043733 A1* | 2/2017 | Blandin | B60K 35/00 |
| 2019/0227126 A1* | 7/2019 | Books | G01R 31/3647 |
| 2020/0184742 A1 | 6/2020 | Jiang et al. | |

OTHER PUBLICATIONS

Xi Chen et al., "Beyond Expert-Level Performance Prediction for Rechargeable Batteries by Unsupervised Machine Learning", Oct. 6, 2019, Advanced Intelligent Systems/vol. 1, Issue 08/1900 102, 28 pgs.

Donal P. Finegan et al., "Battery Safety: Data-Driven Prediction of Failure", Joule 3, Nov. 20, 2019, 3 pgs.

Zhi-Tlao Wang et al., "A Prediction Method for Voltage and Lifetime of Lead-Acid Battery by Using Machine Learning", Energy Exploration & Exploitation, 2020, vol. 38(1), pp. 310-329.

Gregory W. Ratcliff, "Case Study: Real World Battery Failure Prediction", Battery Power Online, Aug. 25, 2021, 9 pgs.

\* cited by examiner

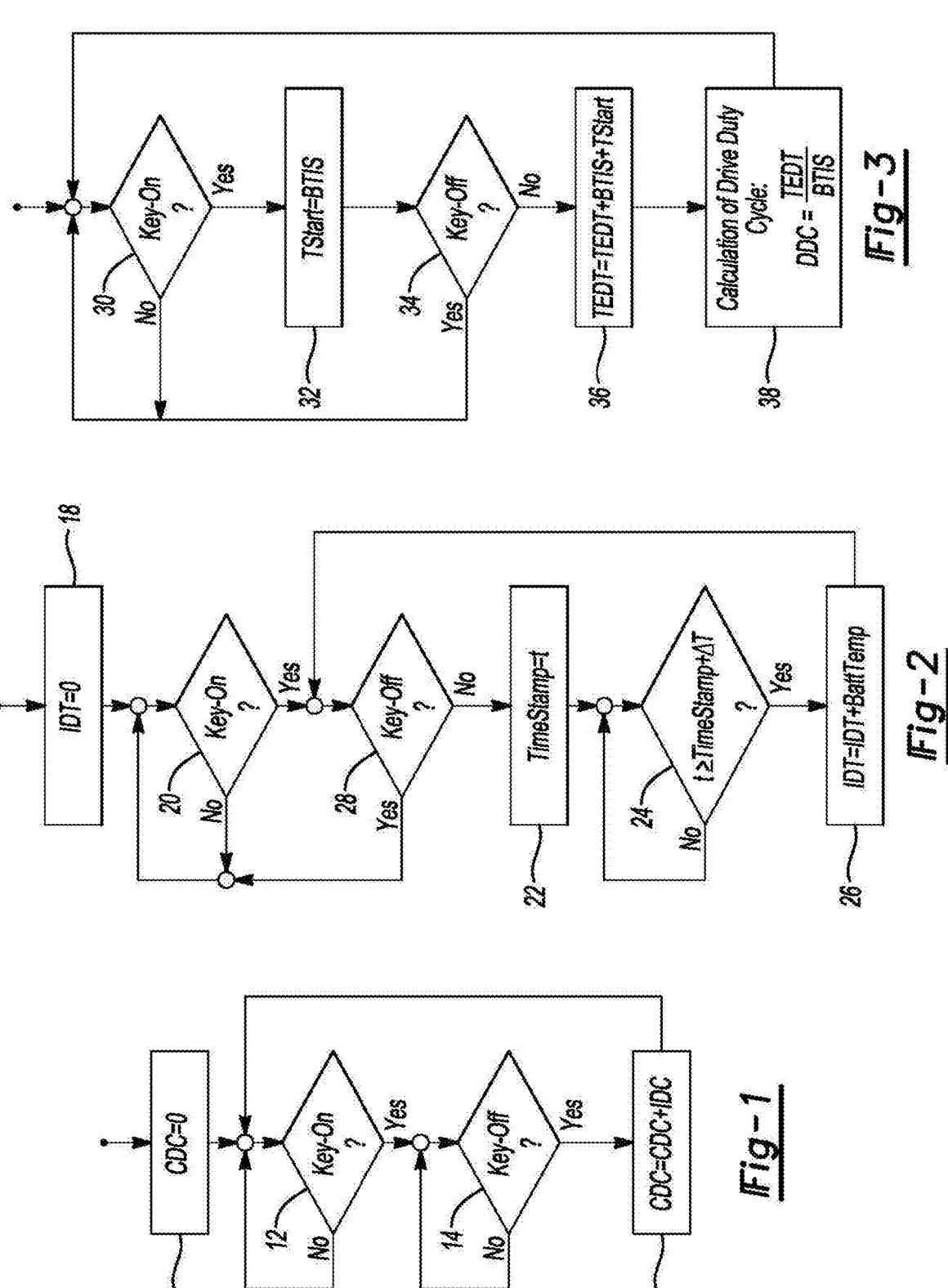

*Fig—7*

*IFig-13*

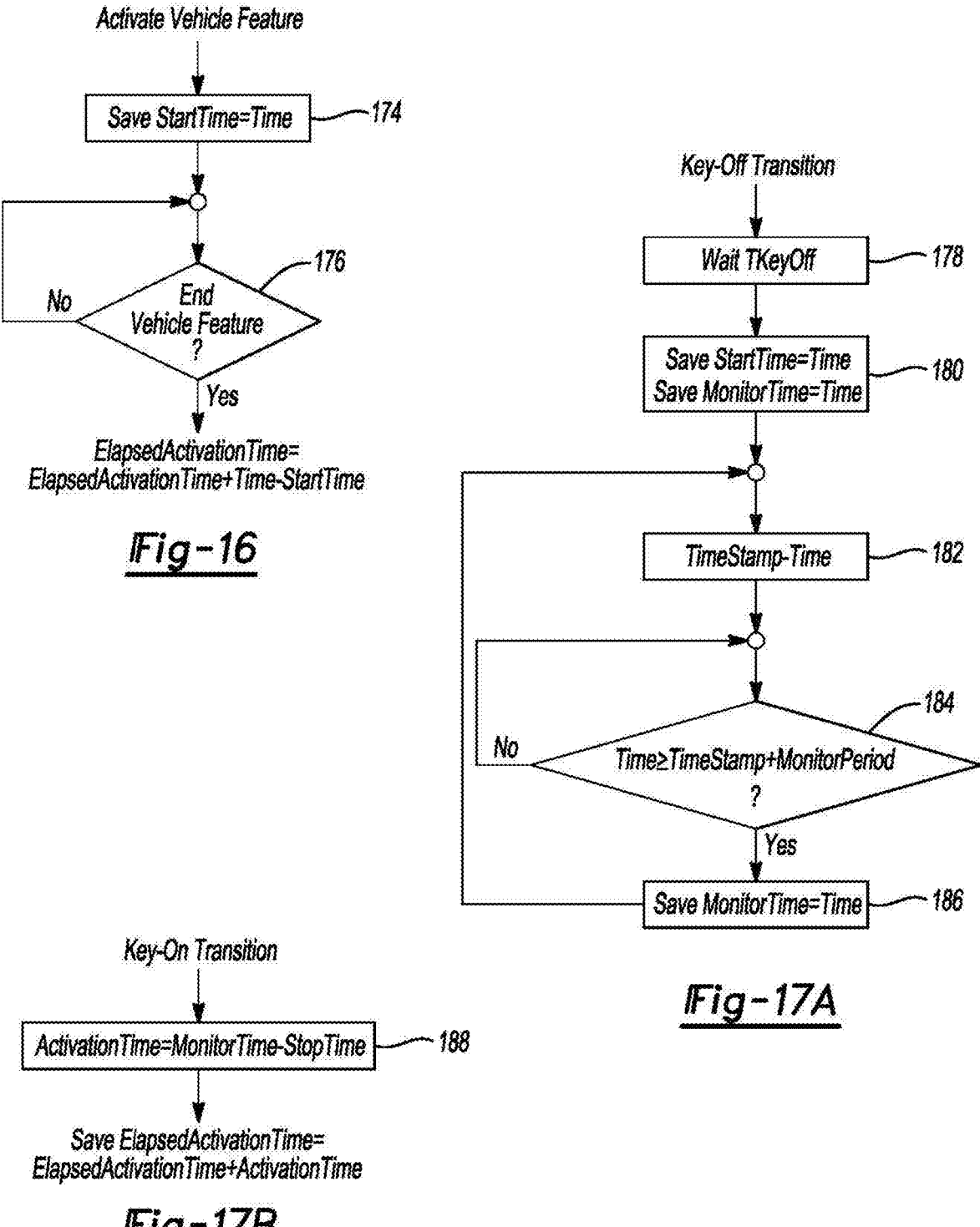

Activate Vehicle Feature

Save StartTime=Time — 174

End Vehicle Feature ? — 176

No

Yes

ElapsedActivationTime=
ElapsedActivationTime+Time-StartTime

*Fig-16*

Key-Off Transition

Wait TKeyOff — 178

Save StartTime=Time
Save MonitorTime=Time — 180

TimeStamp-Time — 182

Time≥TimeStamp+MonitorPeriod ? — 184

No

Yes

Save MonitorTime=Time — 186

*Fig-17A*

Key-On Transition

ActivationTime=MonitorTime-StopTime — 188

Save ElapsedActivationTime=
ElapsedActivationTime+ActivationTime

*Fig-17B*

BATTERY ISSUE IDENTIFICATION AND CONFIDENCE-LEVEL BASED REMEDIAL ACTION

TECHNICAL FIELD

This disclosure relates to automotive power systems.

BACKGROUND

Some lead-acid batteries are used in vehicles for electrical energy storage at a 12V level for starting the vehicle and for powering electrical functions while the primary low-voltage power source is not active. The primary power source may be inactive when the vehicle is parked or during stop-start operation.

SUMMARY

A control arrangement for a vehicle includes a controller that, while the vehicle is parked and responsive to data being indicative of key-off loads exceeding a load threshold with a confidence that exceeds a first confidence threshold, deactivates at least one electronic control unit of the vehicle, and responsive to data being indicative of key-off loads exceeding the load threshold with a confidence that exceeds a second confidence threshold that is greater than the first confidence threshold, prevents user activation of an entertainment system of the vehicle.

A method for a vehicle includes after receiving data indicating key-on loads exceed a load threshold with a confidence that exceeds a first confidence threshold, preventing power flow to at least one auxiliary power outlet of the vehicle, and after receiving data indicating key-on loads exceed a load threshold with a confidence that exceeds a second confidence threshold greater than the first confidence threshold, preventing power flow to snowplow equipment of the vehicle.

A vehicle includes a battery and a controller. The controller, responsive to data being indicative of key-off loads exceeding a load threshold with a confidence that exceeds a first confidence threshold, deactivates at least one electronic control unit of the vehicle, and responsive to data being indicative of key-on loads exceeding another load threshold with a confidence that exceeds a second confidence threshold, dims interior lighting of the vehicle.

BRIEF DESCRIPTION OF THE DRAWINGS

FIG. 1 is a flow chart of a calculation of integral of charge current over all drives.

FIG. 2 is a flow chart of a calculation of integral of temperature over all drives.

FIG. 3 is a flow chart of a calculation of drive duty cycle.

FIG. 16 is a flow chart of a calculation of elapsed activation time of a vehicle feature.

FIG. 17A is a flow chart of a timer activation and monitoring mode.

FIG. 17B is a flow chart for an actuation time calculation.

DETAILED DESCRIPTION

Figure 4:
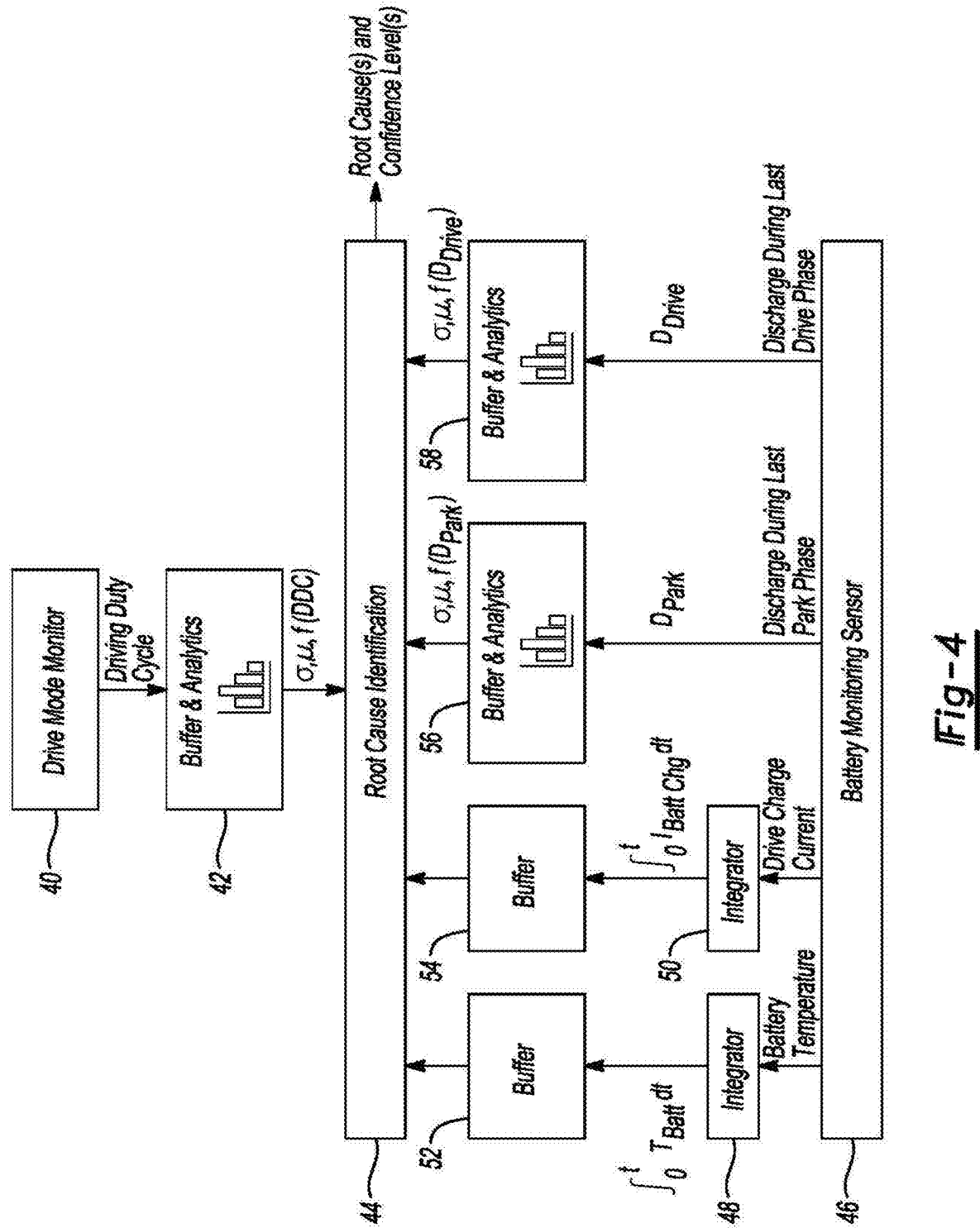
FIG. 4 is a block diagram of inputs to the root cause identification process.

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Discussed herein are algorithms that monitor battery operating conditions such as charge and discharge current and temperature along with vehicle states such as whether the vehicle is being driven or parked. Using this information, it determines the primary (or root) cause or causes of the conditions of a battery when its life is reduced relative to its life expectancy. Root causes are only attributed if the confidence level of their identification exceeds a threshold, and if more than one is identified, they are ranked in order of importance. Different mitigating actions may be taken depending on the confidence level.

This information is provided to the driver, service personnel and to vehicle engineering personnel via a multifunctional display in the vehicle, portable computing devices or computer terminals. With the information, the driver may change his driving and vehicle operating habits to extend the life of the next battery, and he or she may use the information to choose the next battery type and size to increase its useful life. The vehicle may use this information to take automatic mitigation actions depending on confidence level, such as preventing stop/start activity of an engine, etc. Service personnel may use the information to advise the driver regarding vehicle operation or the choice of the replacement battery. The information may also be used to determine whether a battery should be replaced. Furthermore, the vehicle engineering staff may use the information to choose the battery type and size for future vehicles.

While monitoring battery and vehicle states, it identifies operation that will likely lead to premature battery wear. If one or more potential root causes are identified that will likely lead to premature battery wear, it may alert the driver and service personnel. An alert may also be sent to a data bank that is monitored by vehicle engineering personnel. The information may be used by the driver to change vehicle operation in such a way to maximize battery life or to prematurely replace the battery with a type and size that is more suitable for his driving or operational habits. Here too, service personnel may use the information to advise the driver regarding vehicle operation or the choice of the replacement battery.

Root causes are technical in nature. They include "High Charge Throughput" and "Primary Power Source Saturation." However, a driver may not know how to act after a root cause has been communicated. For this reason, the messaging strategy uses the identified root causes to trigger associated recommendations on how a driver may improve the life expectancy of the installed battery or a replacement battery. The strategy may also take automatic action to improve life expectancy.

A 12V battery type and size is chosen for each vehicle in order to ensure that a high percentage of batteries that are installed achieve a targeted life expectancy. However, some batteries may not achieve the target life expectancy, because the vehicle is operated in unforeseen or abnormal ways.

Unforeseen or abnormal operation includes high key-off loads that regularly drain the battery when the vehicle is parked, infrequent driving, frequent short drives, continuous operation in extreme cold ambient temperatures, and continuous operation in regions with a very warm ambient temperature. High key-off loads may be caused by excessive use of the vehicle's entertainment or telematic systems while the vehicle is parked, or they may be caused by the installation of aftermarket equipment in the vehicle. This may include battery chargers, cooling and surveillance equipment. All of these causes of high key-off loads are considered to be unforeseen or abnormal operation if the vehicle is not designed to support them. In some cases, multiple root causes may be present.

Depending on the details of regular unforeseen operation of a vehicle, the target battery life may be achieved by changing the battery size and type. In other cases, this is not practically possible due to limitations in battery technology, packaging space and expense. In that case, the target battery life may be achieved by changing the operation of the vehicle. This may mean that the vehicle is driven more, or that the engine is started whenever the entertainment systems are used for a long period of time.

If a battery's life ends prematurely, i.e., before its targeted life expectancy, it would be useful for the vehicle owner and service personnel to understand why. With this information, the driver may change the operation of the vehicle or have a different battery size or type installed in order to meet the life-expectancy target for the next battery. The same information may be used to understand why a battery's life ended prematurely, even if it met its targeted life expectancy.

Recommendations concerning changing operation or installing a different battery size or type may be communicated to the owner by service personnel who have access to information, or the owner may receive recommendations directly. Two levels of information are provided. One is an identification of the root cause or causes and their ranking in case more than one is identified. The other is advice on how to avoid the root cause or causes or automatic implementation of mitigating actions.

Service personnel may also use the information to determine whether a battery that has a short life should be replaced. For example, a battery that has a short life caused by regular use of the entertainment system while the vehicle is parked may not qualify the owner for a battery replacement.

Engineering personnel may also use the information to gain insight on why batteries stop working prematurely in some vehicles. Root causes may be sent to a data bank including an identification of the vehicle model, and the data bank may be used to make decisions to correct the design of a vehicle's power supply or to guide the development of power supplies in future vehicles.

While a vehicle is in the hands of the owner and operating, the proposed strategies identify operation and battery states that will likely lead to premature end-of-life and may alert the vehicle owner and service personnel to the associated potential root causes. The information may be used by the driver to change vehicle operation, to prematurely replace the battery with one of a type and size that is more suitable for regular operation, or both. Here too, service personnel may receive alerts of potential root causes and make recommendations regarding changes in vehicle operation and battery replacement options. In either case, the recommendations may optionally come from a second layer of information that is provided.

The operational modes, "identifying the root cause of premature end-of-life" and "alerting to conditions that will lead to a premature end-of-life" use the same calculation framework. They calculate the statistics of metrics and compare them to the statistics of vehicles with batteries that are known to have premature end-of-life, i.e., earlier than their target life expectancy, and compare them to statistics of vehicles with batteries that expire at or after the target. Each metric corresponds to a root cause of premature end-of-life, and a root cause is identified if enough statistical similarity exists between the metrics of the monitored vehicle and the metrics of that root cause. If more than one root cause exists, each is listed with a ranking corresponding to that similarity.

The root causes of a battery experiencing premature end-of-life that were implemented include High Key-Off (Parking) Load, High Temperature Operation, High Charge Throughput, Infrequent Driving, and Primary Power Source Saturation or Issue.

More root causes may be added. The calculation framework that evaluates them uses a form of artificial intelligence, supervised learning, to identify similarities to these root causes. In the paradigm of artificial intelligence, the root causes are "Features" that are identified.

The operational modes each have different activation triggers and have different communication strategies. These are described in the following sections.

The proposed techniques include elements for data collection, algorithms that processes the data and a set of communication strategies. Data collection and preliminary processing of the data occurs in the vehicle, while the algorithm for root cause identification and the communication strategy may be best allocated, in certain examples, to a central computing system (cloud) with easy access to large sets of battery data. Specific allocation of elements will be described below.

Metrics for Root Cause Identification

Each root cause corresponds to a metric that is calculated using measurements of vehicle states. Each measurement is made over a period of time corresponding to a mode of operation of the vehicle, and the metrics are functions of the integral of the measured values, their mean values, or their distributions. Table 1 defines the metrics for each root cause, the mode during which a metric is calculated, and the source of the measurements.

The time in service of the battery corresponding to the end of the mode of operation in which the metric is calculated should be stored with that metric for further processing. It represents the amount of time that has elapsed since the battery was installed. The measurement sources are described in more detail below.

monitoring sensor. The corresponding algorithm stores the cumulative charge in non-volatile memory in the vehicle and updates its value after each drive phase. The algorithm is illustrated in FIG. 1.

In FIG. 1, CDC represents the cumulative charge current over all drives. It is initially set to zero at operation 10 when the battery is new and reset to zero every time the battery is replaced. After a key-on transition at operation 12 and when the algorithm senses a key-off transition at operation 14, the value of the cumulative charge current is added to IDC at operation 16, which represents the integrated drive charge during the last drive phase.

The root cause "High Temperature Operation" requires the integral of temperature over time during previous drive phases as a metric. Battery temperature is also measured by a state-of-the-art battery monitoring sensor that is usually mounted on the negative battery pole. The temperature, however, is not integrated over time by the sensor. This may be done by an external software element in the vehicle that receives periodic temperature measurements from the sensor. That algorithm also receives vehicle state information identifying the key-on or key-off state and uses it as a trigger for the calculation of the integral of the battery temperature during key-on operation. The algorithm to calculate the integrated temperature over time is illustrated in FIG. 2. It is assumed that the software element that calculates the integral of temperature has access to the temperature signal from

TABLE 1

Metrics of each Root Cause

| Root Cause | Metric | Mode | Measurement Source(s) |
|---|---|---|---|
| High Key-Off (Parking) Load | Integral of load over time during parking phases | Parking time during which the vehicle is in a state where it cannot drive | Battery Monitoring Sensor |
| High Temperature Operation | Integral of temperature over time while the vehicle is driving including previous driving phases | Time during which the propulsion system is active | Primary: Battery Monitoring Sensor and Drive Mode Monitor Secondary: Temperature Integration Element |
| High Charge Throughput | Integral of charge current during drive including previous driving phases | Time during which the propulsion system is active | Primary: Battery Monitoring Sensor and Drive Mode Monitor Secondary: Current Integration Element |
| Infrequent Driving | Driving duty cycle defined as the total elapsed (integrated) driving time divided by the time in service of the battery | Time during which the propulsion system is active | Drive Mode Monitor |
| Primary Power Source Saturation or Issue | Integral of discharge current over drives | Time during which the propulsion system is active | Battery Monitoring Sensor |

Battery Monitoring Sensor and Integration Elements

Measurements of the integrated charge and discharge current over time during key-off (parking) phases and key-on (driving) phases of operation are automatically made by state-of-the-art battery monitoring sensors. They receive vehicle state information identifying the key-on or key-off state and use it as a trigger for the calculation of the integral of the current.

The root cause "High Charge Throughput," however, requires the integral of charge current during drive including previous driving modes. In order to realize this metric with a state of the art sensor, the cumulative charge over each drive phase must be added to the cumulative charge of the previous drive phase. This may be done by a software element that is implemented in an electronic control unit in the vehicle that has access to the output signals of the battery the battery monitoring sensor, a signal identifying whether the vehicle is in a key-on or key-off operational mode, and a time signal that increments as the vehicle drives.

In FIG. 2, IDT represents the integrated temperature over all drives. Its value is stored in non-volatile memory in the vehicle and is initially set to zero at operation 18 when the battery is new. It is reset to zero every time the battery is replaced. When the algorithm senses a key-on transition at operation 20, a time stamp is stored in the value TimeStamp at operation 22. Once the time signal t exceeds the sum of the time stamp and a predefined parameter $\Delta T$, representing the sampling rate, at operation 24, the measured temperature is added to the value of the integrated temperature at operation 26. This continues until a key-off transition is identified at operation 28.

Drive Mode Monitor

The root cause "Infrequent Driving" requires the calculation of the driving duty cycle defined as the total elapsed driving time divided by the time in service of the battery. The time in service is also calculated and made available as a signal by a state-of-the-art battery monitoring sensor. The drive mode monitor is implemented in the vehicle and receives the battery time in service as well as vehicle state information identifying the key-on or key-off state and uses it as a trigger for the calculation of the total elapsed driving time during key-on operation. Calculation of the total elapsed drive time includes all previous drives in a defined time-in-service interval. The time-in-service intervals will be defined in more detail below. Calculation of the drive duty cycle is illustrated in FIG. 3.

In FIG. 3, BTIS corresponds to the battery time in service, TEDT is a variable defining the total elapsed drive time, and DDC represents the drive duty cycle. The total elapsed drive time TEDT should be stored in non-volatile memory in the vehicle between drives. After a key-on transition at operation 30, TStart is set equal to BTIS at operation 32. Provided a key-off transition is not detected at operation 34, TEDT is updated according to the equation shown at operation 36. The DDC is then calculated at operation 38.

Root Cause Identification

The root cause identification process receives inputs from the battery monitoring sensor directly (integrals of discharge after each parking event and after each drive event), from the integration elements that include information from previous drives (integrals of temperature and charge current during all accumulated drives), and from the drive mode monitor (drive duty cycle) that are described in the sections above. As previously mentioned, the algorithm for root cause identification, in certain examples, is best allocated to a central computing system (cloud) where it has access to large sets of battery data. Specific allocation of the root cause identification algorithm will be described below.

Inputs to Root Cause Identification Algorithm

The identification process classifies the inputs into two types. The integrals of discharge current after a drive or park phase as well as the calculation of the drive duty cycle described above belong to the first type. They are sampled after every drive and park phase, and their values are stored in a buffer in non-volatile memory in the vehicle. The mean value, standard deviation and probability density function of the values of the buffer are recalculated every time a new value is added. The calculation of these statistical metrics is calculated in some implementations in the vehicle. They are also stored in non-volatile memory in the vehicle and are sent to the central computing system (cloud) after every parking or drive phase as inputs to the root cause identification process.

The outputs of the integration elements, integrals of temperature and charge current during all accumulated drives, belong to the second type of inputs. Because these outputs are cumulative, they are not reset after each drive or parking phase. While they may be stored in a buffer in non-volatile memory, their values change after each drive and park phase, but no statistical analysis of the values occurs in the buffer. The integrated values are also sent to the central computing system (cloud) after every parking or drive phase as inputs to the root case identification process.

FIG. 4 illustrates the inputs to the root cause identification process. $D_{Park}$ and $D_{Drive}$ correspond to the discharged coulombs that occurred during the last park or drive phase of operation. These values and updated values of the driving duty cycle are stored in buffers. Statistical metrics of each of these values are recalculated each time a new value is added to the respective buffer. The statistical metrics include the mean p, standard deviation σ and probability density function f(..). As will be discussed below, the outputs of the root cause identification process include probable root causes for a battery early-end-of-life and the confidence level of the identification of those causes.

Driving duty cycle output from drive mode monitor 40 is fed to buffer and analytics 42. The mean, standard deviation and probability density function output from the buffer and analytics 42 are fed to root cause identification 44. Battery temperature and drive charge current output from battery monitoring sensors 46 are respectively fed to integrators 48, 50. The integral output by each is fed to respective buffers 52, 54. Data regarding discharge during last park phase output from the battery monitoring sensors 46 is fed to respective buffer and analytics 56, 58. Outputs from the buffers 52, 54 and buffer and analytics 56, 58 are fed to the root cause identification 44.

Root Cause Identification Algorithm

The root cause identification algorithm is based on a supervised-learning method that compares metrics that correspond to root causes from a given vehicle with statistical parameters of the metrics corresponding to vehicles with batteries that stopped working either prematurely or properly (after the targeted life expectancy). Those metrics may be a single value, as in the case of the integrated battery temperature (Root Cause: "High Temperature Operation") or integrated drive charge current (Root Cause: "High Charge Throughput"). The metrics may also be a set of statistical parameters corresponding to a set of measurements, as in the case of discharge during last parking or driving phases (Root Causes: "High Key-Off Loads" or "Primary Power Source Saturation").

The algorithm compares the metrics that it receives that correspond to root causes with statistical parameters of the same metrics corresponding to a large set of vehicles with batteries that stopped working prematurely or properly. The statistical parameters of the large data sets of metrics include the mean, standard deviation and probability density function. Root cause or causes that are most similar to the measured metrics are identified by the algorithm. If the measured metrics are most similar to those of a battery that is aging properly, no root cause but a properly aging battery is identified. The comparison that is carried out by the algorithm is illustrated generically in FIGS. 5A and 5B.

Figures 5A, 5B:
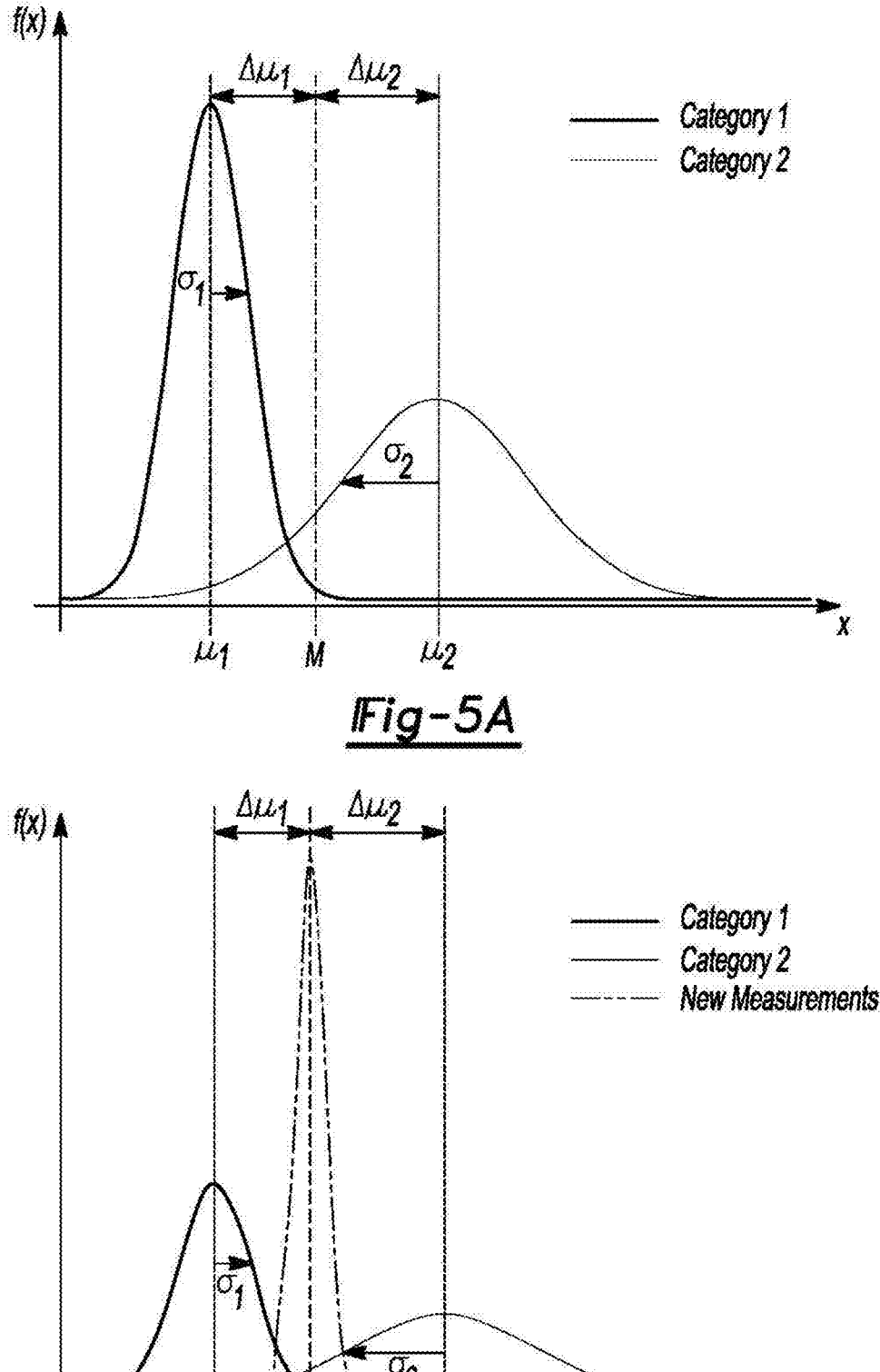
FIG. 5A is a plot of a single measurement value M mapped against means, standard deviations, and probability density functions of two established categories.
FIG. 5B is a plot of mean and probability density functions of a set of new measurements mapped against means, standard deviations, and probability density functions of two established categories.

FIG. 5A illustrates the case in which a single metric value M is mapped against a set of measurements corresponding to two categories. The categories correspond to "Prematurely Aging" and "Properly Aging". The metric may be an integral value corresponding to a root cause such as "High Temperature Operation" or "High Charge Throughput." The similarity of the single metric to each of the two categories is a function of the mean values g, standard deviations a and probability density functions f(x) that characterize those categories.

FIG. 5B illustrates the case in which a set of new measurements from a vehicle that is being monitored is mapped against a set of measurements corresponding to two categories. The categories correspond to "Prematurely Aging" and "Properly Aging." The metric corresponds to a root cause such as "High Key-Off Loads" or "Primary Power Source Saturation." The similarity of the set of new measurements to each of the two categories is a function of the mean values p, standard deviations a and probability density functions f(x) that characterize those categories and the new set of measurements.

The characteristics of the data corresponding to a root cause that represents each category ("Prematurely Aging" and "Properly Aging") changes over time. This is especially true of metrics that are integrated over the life of the battery (corresponding to "High Temperature Operation" and "High Charge Throughput"). In order to maintain accuracy in the similarity assessment, the data that is used for categorization depends on the time in service of the battery. Instead of one set of categorization data (or parameters such as mean values, standard deviations and probability density functions) representing each category ("Prematurely Aging" and "Properly Aging") for each root cause, multiple sets corresponding to defined time-in-service intervals are available and used. The intervals may correspond to days, weeks or months and may not have equal length. The measurement data that is stored for each category of each root cause as well as the root cause identification algorithm may be stored in a central computing system (cloud).

The algorithm that identifies a properly aging battery or the most probable root cause or causes carries out a process known as linear discriminant analysis. The process also provides a metric that describes the confidence level of the classifications that it makes. The degree of similarity to a dominant category is estimated and expressed as the confidence level of the association with one category or another for each root cause. A high level of certainty or confidence is required when a battery is classified as prematurely aging if the classification effects expense. For this reason, the communication strategies described below use the confidence level as part of the decision criteria to trigger messages to the customer. Like the data that is used to categorize root cause metrics as belonging to "Prematurely Aging" or "Properly Aging" sets, the identification algorithm may be implemented in a central computing system (cloud).

Classification Strategy to Identify the Root Cause of a Battery Aging Prematurely In order to identify the causes of a battery aging prematurely, its feature values (metrics) are mapped to the statistical information for correctly aging and prematurely aging batteries for that battery's size and type. The known technique of linear discriminant analysis is carried out in order to classify the battery in question as being more similar to the batteries that experienced correct aging or more similar to the batteries that experienced premature aging (the initial identification of a prematurely aging battery). Linear discriminant analysis is a supervised-learning method that compares the measurements of features that it receives with statistical parameters of the same metrics corresponding to two categories: batteries that faulted prematurely or properly. The statistical parameters of the data sets of features corresponding to each category include the mean values y, standard deviations a and probability density functions $f(x)$. The category that is most similar to the measured features is identified by the algorithm. Figures SA and SB illustrate the distributions and statistical parameters corresponding to two categories of a feature and the boundary that may be used to sort a single measurement into one category or another. The boundary is defined by the value of the feature x that fulfills the following inequality:

$$\pi_1(x)f(x|D_1) = \pi_2(x)f(x|D_2), \tag{1}$$

where $\pi_i(x)$ is the prior probability function defining the probability that the measured value x is in the category $i \in 1$, 2 and $f(x|D_i)$ is the value of the probability density function value of the category i. The training data defining the two categories is defined by $D_1$ and $D_2$. The characteristics of the data that define a categorization (batteries that faulted prematurely or properly) changes over time. In order to maintain accuracy in the similarity assessment, the data that is used for categorization depends on the time in service of the battery. Instead of one set of categorization data (or parameters such as mean values, standard deviations, and probability density functions), multiple sets corresponding to defined time-in-service intervals are available and used. The intervals may correspond to days, weeks, or months, and may not have equal length. The measurement data that is stored for each category may be stored in a central computing system (cloud). Linear discriminant analysis is applied to all the data that is measured during an interval as it is made available. This means that a growing set of measured data is compared with stored sets of data corresponding to category 1 and category 2, i.e., batteries that faulted prematurely or properly. When a set of data X that was measured in an interval is processed, linear discriminant analysis chooses the category i* that maximizes a posterior probability function:

$$i^* = \max_i \pi_i(X)f(X|D_i), \tag{2}$$

The linear discriminant analysis process also may be used to calculate the confidence level of the classifications that it makes. The confidence level is the probability that the correct category is chosen given the set of measured data. That probability may be calculated by the equation $$p_i(X) = \frac{\exp(s_i(X))}{\sum_{j=1}^{R} \exp(s_j(X))}, \tag{3}$$

where $s_i(X)$ is a function that is dependent on the means and the covariances of the training data that corresponds to each category as well as the prior probability function $\pi_i(X)$.

Figure 6:
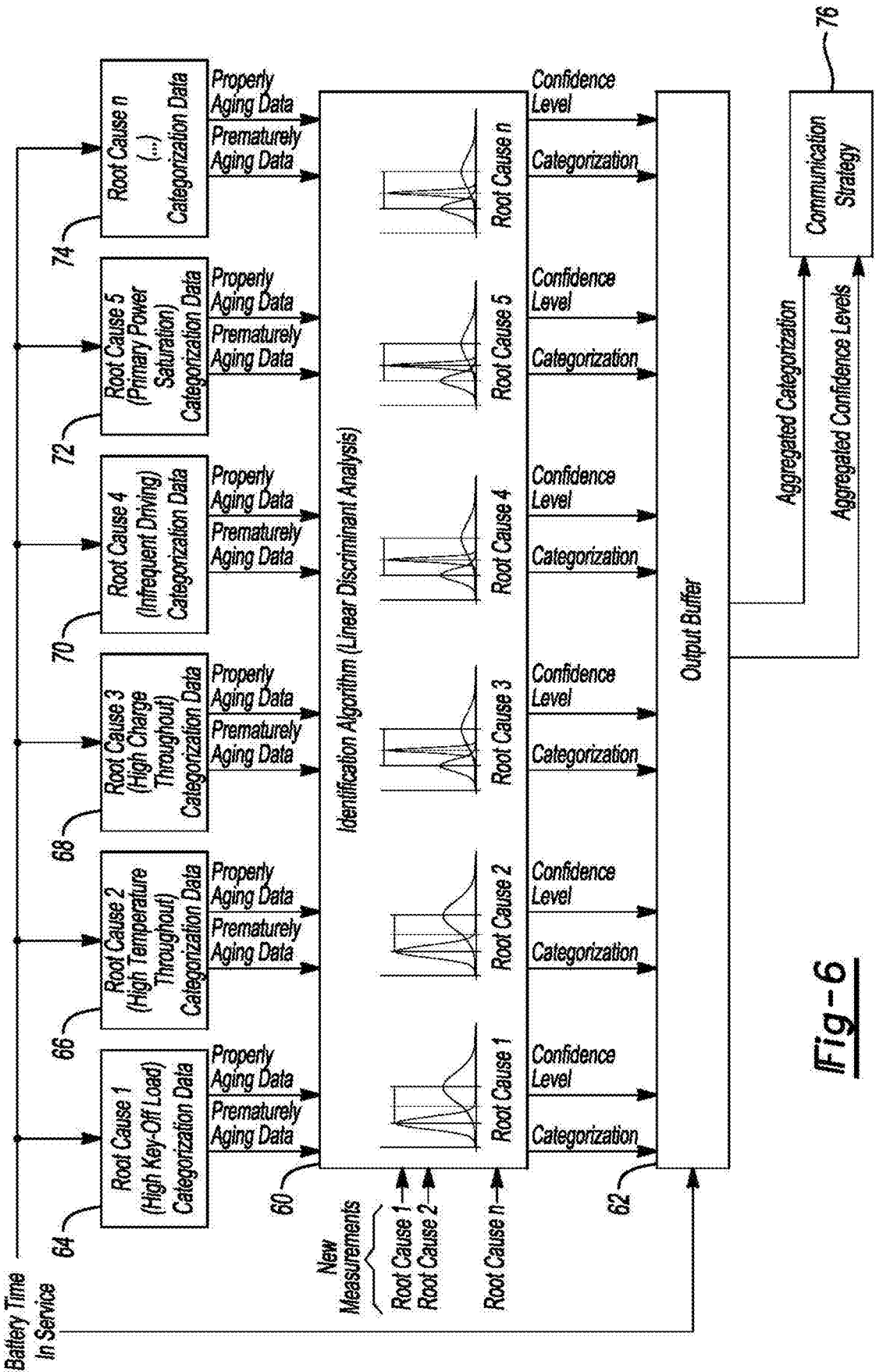
FIG. 6 is a block diagram of the interconnections between categorization data banks, the identification (categorization) algorithm, the output buffer, and the communication strategy.

As illustrated in FIG. 6, the outputs of identification algorithm 60 to output buffer 62 are categorizations for each root cause and confidence levels for the categorizations. It stores the categorizations and confidence levels that are being computed for each root cause 64, 66, 68, 70, 72, 74 during the current time interval and updates them internally as they change. It also stores the last outputs of the previous time interval.

After a new time-interval begins, enough new measurements should be collected in order to be sufficiently statistically significant for identifying a category for each root cause. In order to facilitate this, the last outputs of the previous interval are used as inputs to communication strategy 76 until a defined period of time has passed, during which new measurements are collected. This approach minimizes false-positive identifications of a root cause due to outlying measurements that occur early in a new time interval. The defined period of time may be defined by a calibrated parameter. It is designated as T_StatSig in FIG. 7 and is compared to the elapsed battery time in service after a new time interval has begun.

Figure 7:
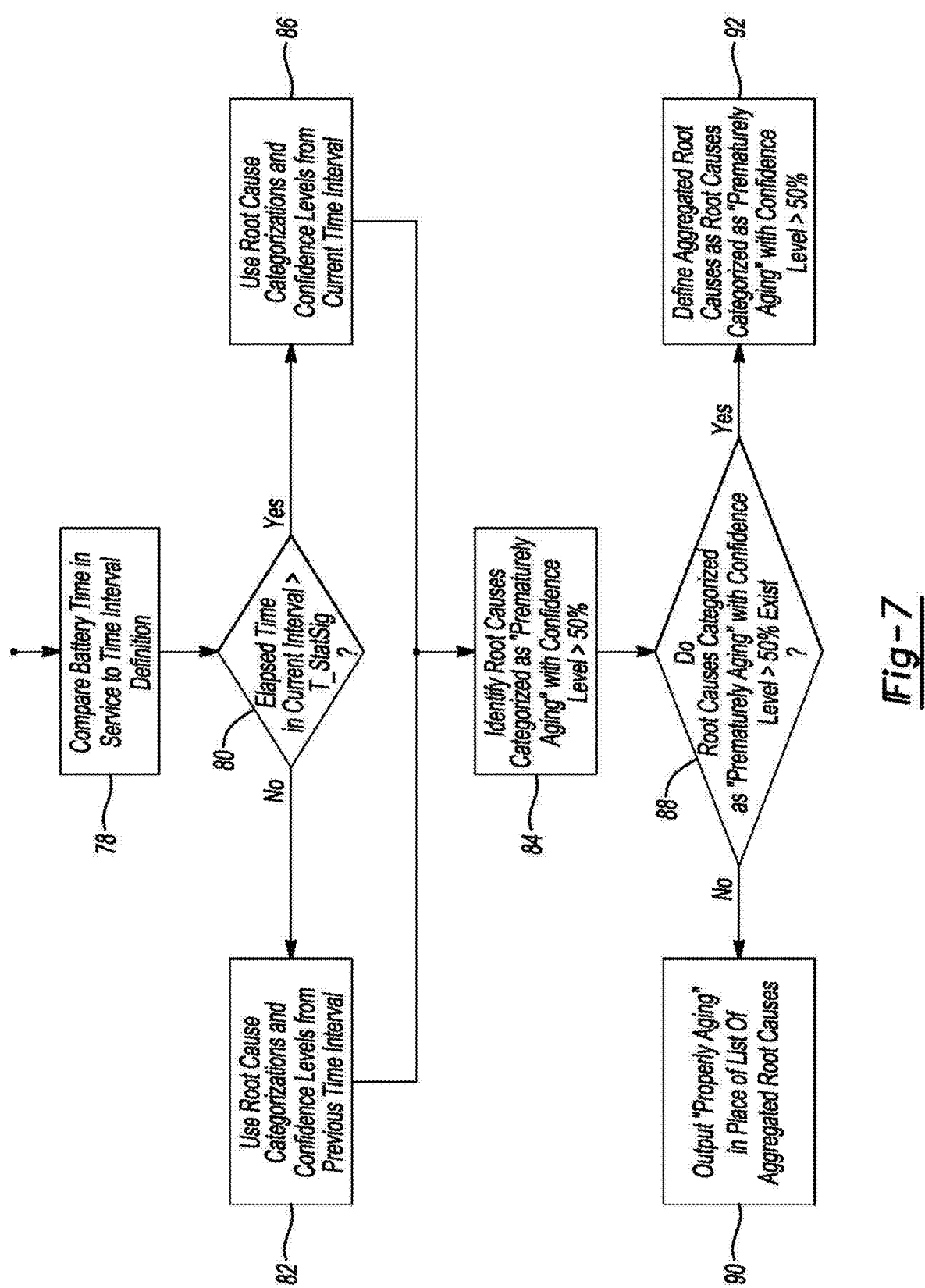
FIG. 7 is a flow chart of a process of defining the aggregated categorization and confidence levels in the output buffer.

The output buffer decides whether the categorizations of the previous or the current time interval are valid by assessing the elapsed time in the current interval as described above. The root cause or causes that are identified as belonging to the "Prematurely Aging" category in the valid time interval and their confidence levels are classified as being the aggregated categorization and aggregated set of confidence levels. As illustrated in FIG. 6, they are sent to the communication strategy 76. If no root causes are categorized as "Premature Aging" the aggregated categorization is "Properly Aging". The process of defining the aggregated categorization and confidence levels in the output buffer 62 is illustrated in FIG. 7.

At operation 78, battery time in service is compared to the time interval definition. At operation 80, it is determined whether the elapsed time in the current interval is greater than T_StatSig. If no, the root cause categorizations and confidence levels from the previous time interval are used at operation 82. At operation 84, the root causes categorized as "Prematurely Aging" with confidence level greater than 50% are identified. Returning to operation 80, if yes, the root cause categorizations and confidence levels from the current time interval are used at operation 86. The algorithm then proceeds to operation 84.

At operation 88, it is determined whether root causes categorized as "Prematurely Aging" with confidence level greater than 50% exist. If no, "Properly Aging" is output in place of the list of aggregated root causes at operation 90. If yes, root causes categorized as "Prematurely Aging" with confidence level greater than 50% are defined as the aggregated root cases.

FIG. 6 illustrates the interconnections between the battery measurement data banks 64-74 that are used for categorization, the identification algorithm 60 that performs linear discriminant analysis, the output buffer 62 and the communication strategy 76. It is assumed that all of these elements may be implemented in a central computing system (cloud) offboard the vehicle. It may be noted that the time in service signal is an input to the battery measurement data banks 64-74 that are used for categorization and to the output buffer 62. It is used to establish the time interval and to choose the corresponding categorization data sets. It is also used by the output buffer 62 to choose whether the current or previous outputs of the identification algorithm 60 are sent to the communication strategy 76.

The battery time-in-service signal is reset to zero by maintenance personnel when a battery is replaced. When this occurs, the set of new measurements that are stored in the data buffers 52, 54 illustrated in FIG. 4 and the stored categorization data in the output buffer 62 illustrated in FIG. 6 are erased.

FIG. 6 also illustrates that the identification of root causes consists of a set of parallel categorization processes. Each root cause is categorized in parallel with the others as being more similar to the set of measurements corresponding to a "Properly Aging" or "Prematurely Aging" battery. In the output buffer 62, a decision is made to use the categorizations from the previous or current time interval depending on the elapsed time in the interval. Finally, the categorizations indicating premature aging are bundled and outputted as an aggregated categorization.

Battery Measurement Data Bank for Supervised Learning

The root cause identification algorithm that was described above applies supervised-learning to the measurement-derived metrics that are collected from a vehicle. The method requires sets of data corresponding to the metrics that are known to belong to the categories ("Prematurely Aging" and "Properly Aging") and assigns new metrics from a target vehicle to one category or another based on the statistical similarity of the new metrics to those in each known set.

Strategies herein also contemplate the concept of adding data to the sets corresponding to the categories. The data comes from vehicles that are monitored to identify root causes. Measurement-derived metrics are collected from the vehicles until the batteries stop functioning. Each measured value is associated with a time stamp corresponding to the time in service of the battery. After a battery stops functioning, its time in service is compared with the targeted life expectancy. If the time in service when the stoppage occurs is greater than the target, the battery is classified as having aged correctly. Otherwise it is classified as aging prematurely. The measurement-derived metrics are sorted for each classification ("Prematurely Aging" and "Properly Aging") and for each combination of battery size and type.

As described above, categorization of new metrics is done with sets of pre-categorized data that correspond to defined time-in-service intervals in order to maintain accuracy in the similarity assessment. Hence, measurements that are collected are classified as belonging to the classifications "Prematurely Aging" and "Properly Aging" and are sorted into the defined time intervals when they are permanently entered into the categorization data sets. Those data sets are stored in a data bank located in a central computing system (cloud). That data bank contains categorized data sets for each category of battery that is sorted into the defined time intervals for each combination of battery size and type that is being monitored. Hence, separate categorized data sets may be maintained for 80 Ah flooded batteries, 80 Ah AGM batteries and all other battery sizes and types that are being monitored, for example. Also, features may correspond to the metrics that are used for comparison. The features may correspond to "The Integral of Load over Time during Parking Phases," "Integral of Temperature over Time," and the others defined above. The data may include the metrics themselves (integrated current or temperature) or statistics describing the metrics such as the probability density function, mean and standard deviation of the metrics that are gathered over time. Each piece of data can be associated with a "Time in Service" (TIS), which is the amount of time that has elapsed since the battery was installed.

Figure 8:
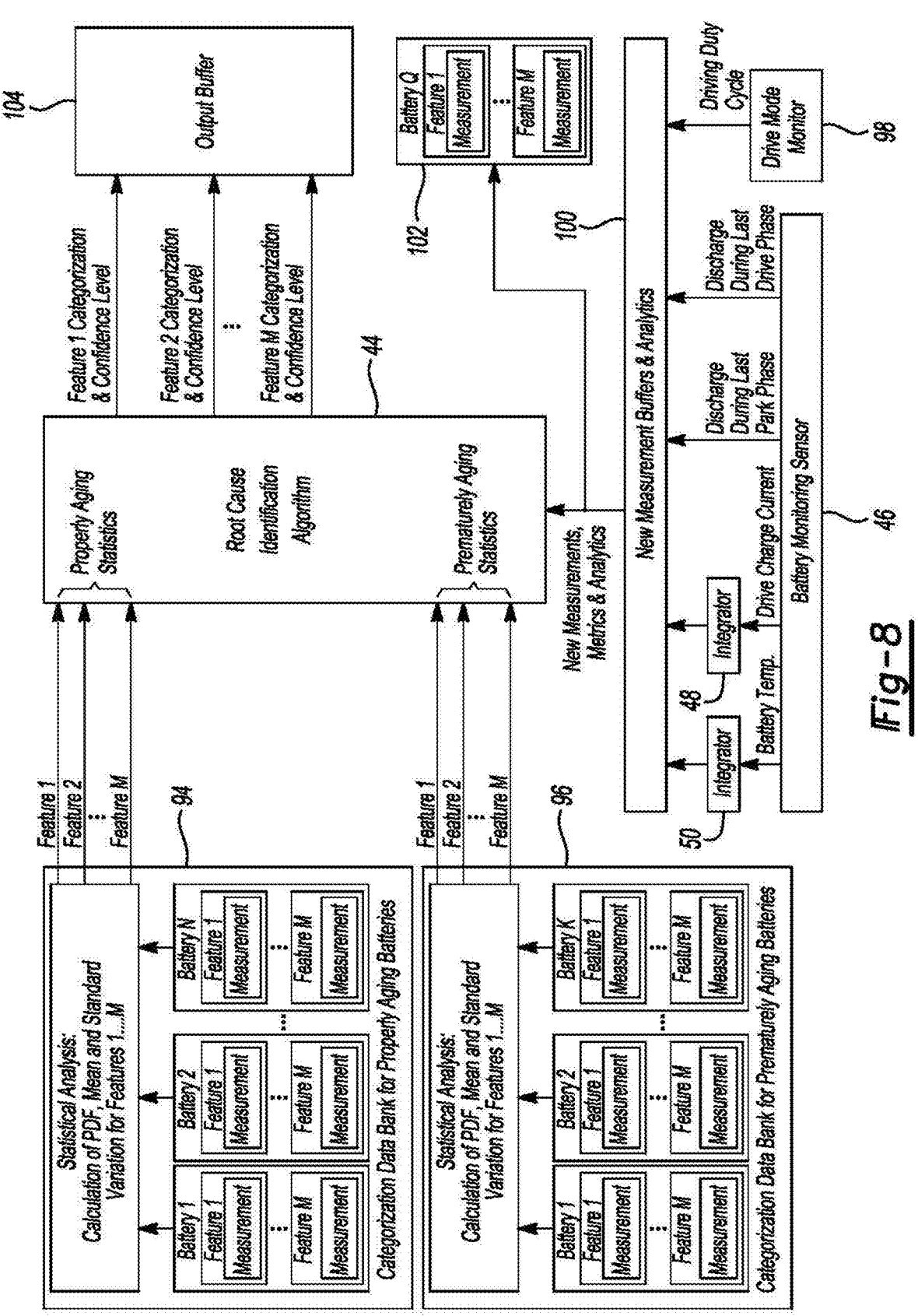
FIG. 8 is a block diagram of an identification algorithm and battery categorization data banks for supervised learning.

A schematic diagram of the interfaces between the battery measurement data bank, the identification algorithm and the measurement metric sources is illustrated in FIG. 8. Only the categorization data banks for one specific battery and time interval are shown.

Data for N batteries is maintained in a data bank 94 for correctly-aging batteries, and data for K batteries is maintained in data bank 96 for prematurely-aging batteries. Measurement metrics of M features for each of the N+K batteries are saved in the two data banks 94, 96.

The battery measurement metrics and statistical information that are stored in the data banks 94, 96 are provided to the root cause identification algorithm 44, which uses it to categorize a monitored battery as described above using newly-measured metrics. The newest measurement metrics from the vehicle, including those from driving mode monitor 98, are supplied to the root cause identification algorithm 44 by the "New Measurement Buffers and Analytics" 100. Also, outputs of the root cause identification algorithm 44 are fed to output buffer 104. The root cause identification algorithm 44 is triggered whenever a new measurement is sent to the central computing system (cloud).

Figure 9:
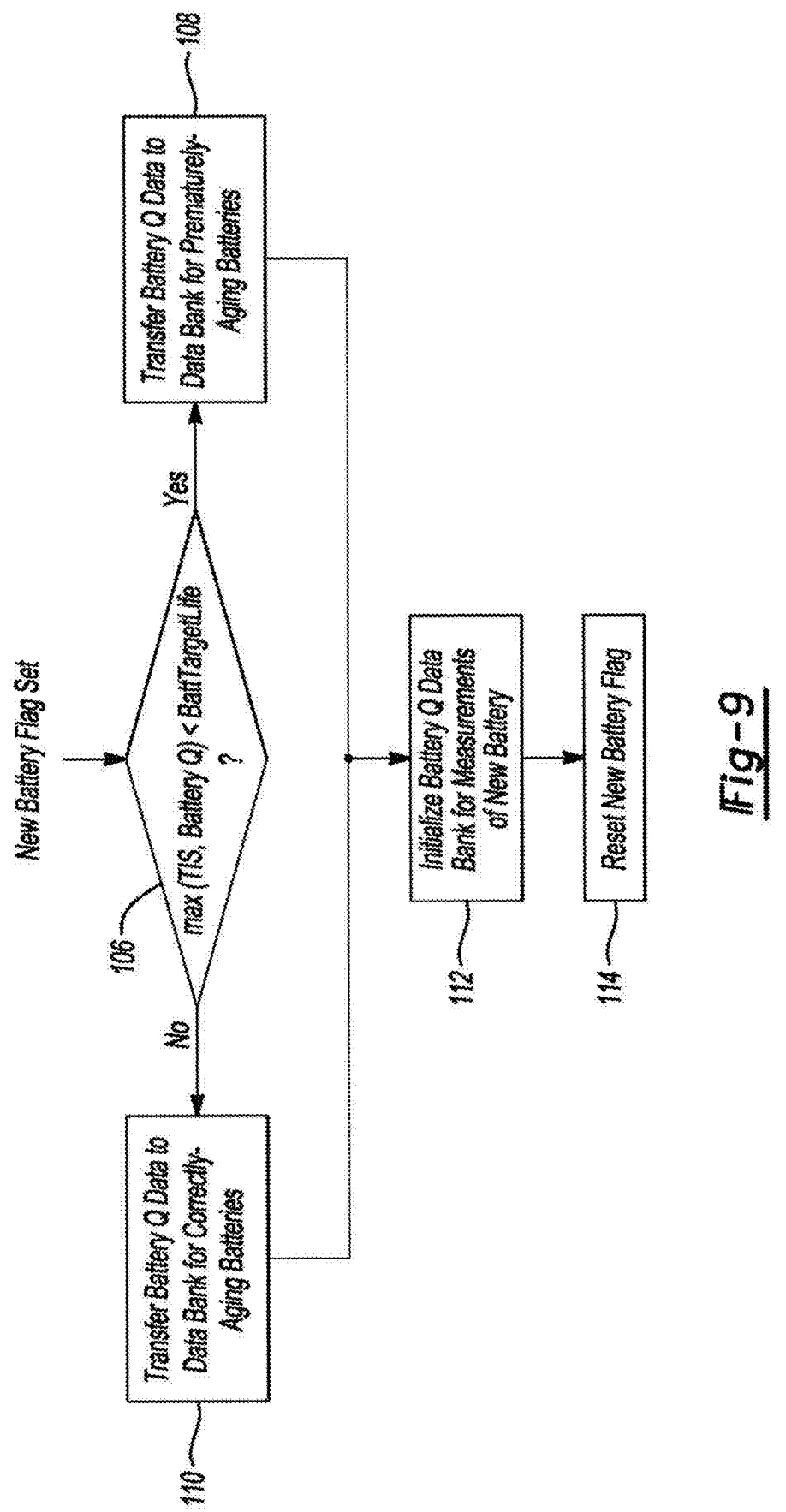
FIG. 9 is a flow chart of a battery data bank management process to implement supervised learning.

FIG. 9 illustrates the supervised-learning process to update the data banks 94, 96 that are ultimately used to monitor aging of a battery in a vehicle. Every new measurement metric of the battery being monitored and its corresponding time in service is stored in a data bank 102 designated "Battery Q." The measurement metrics of the battery being monitored cannot be added to the data banks that are used for supervised learning until the battery comes to its end of life and is replaced. When this occurs, the last recorded time in service of the battery that is stored in the data bank 102 for "Battery Q" is compared with the target life expectancy BattTargetLife at operation 106. If the time in service of the battery when it is replaced is less than the target, it is classified as a belonging to the group of prematurely aging batteries. In this case, the measurements collected in the "Battery Q" data bank 102 are added to the measurements for the K batteries in the data bank 96 for prematurely-aged batteries at operation 108. Otherwise, the measurements are added to the data bank 94 for properly-aged batteries at operation 110. A "Battery Q" data bank for new measurements is then initialized for the new battery at operation 112, and the new battery flag is reset at operation 114.

The process is triggered by a flag indicating that the battery has been replaced. It is usual for a service technician to reset the battery monitoring sensor in a vehicle if a battery is replaced. It is assumed that when this occurs, a flag indicating that the battery has been replaced may be set, and this may be communicated to the central computing system (cloud) where the battery data bank and its management strategy is implemented. Even if a vehicle has no onboard battery monitoring sensor, it is assumed that service personnel may send a signal to the central computing center that the battery has been replaced by some means. It is also possible that an onboard battery monitoring sensor has the ability to determine that a battery has been replaced and sends a signal to this effect to the central computing center autonomously.

Communication Strategy

There are several modes of operation proposed. One provides the root cause if a battery stops working. In this case a request is made for the root cause, and information is communicated in one of several ways. The information that is provided depends on whether it was requested by the driver or owner, or whether it was requested by service personnel. Another mode of operation informs a driver, vehicle owner or service personnel that a root cause has been identified that could result in a battery having a life less than its target life. In this case, the information is triggered by comparing the confidence level of identified root causes to a threshold and by other parameters that will be described below.

The communication of a root cause may be accompanied by recommendations to mitigate the cause in the future. The information may be used by the driver or owner to avoid conditions that lead to that root cause or prolong the life of the battery and allow it to achieve its targeted life expectancy. The recommendations may differ depending on whether they are triggered by a request for root causes if a battery is replaced or whether they are triggered as part of information provided to the driver that premature battery expiration may occur in case preventive action is taken. For example, if a battery expires and "High Key-Off Load" is identified as a root cause, the associated recommendation to the vehicle owner may be to minimize use of vehicle features while the vehicle is parked and to install a larger battery. On the other hand, if battery expiration is predicted due to the same root cause, the only recommendation may be to minimize use of vehicle features while the vehicle is parked. Different recommendations may also be given to service personnel. They may receive the same recommendations as the vehicle owner or driver may receive, but, for example, they may be expanded to include information on whether battery expiration would be covered. Tables 2 and 3 are lists of sample recommendations associated with root causes for these two operational modes.

TABLE 2

Recommendations associated with Identified Root Causes

| | Information Request after Battery Issue | |
| --- | --- | --- |
| Root Cause | Customer | Service Personnel |
| High Key-Off (Parking) Load | Minimize use of vehicle features while vehicle is parked. Disconnect after-market loads that drain the battery while the vehicle is parked. Install a larger battery to replace the unit. | Minimize use of vehicle features while vehicle is parked. Check for and disconnect after-market loads that drain the battery while the vehicle is parked. Recommend installation of a larger battery to replace the unit. Warranty is voided if it is found that after-market loads were installed and caused excessive battery drain during parking. |
| High Temperature Operation | Avoid long periods of operation in hot weather conditions. Install an AGM or other battery type to replace unit. | Avoid long periods of operation in hot weather conditions. Recommend installation of an AGM or other battery type to replace unit. Check operation of under-hood fan. |
| High Charge Throughput | Minimize use of vehicle features, while vehicle is parked, Disconnect after-market loads that drain the battery while the vehicle is parked. Disconnect after-market loads that draw high power while the vehicle is in operation. Install a larger battery to replace the unit | Minimize use of vehicle features while vehicle is parked. Check for and disconnect after-market loads that drain the battery while the vehicle is parked. Check whether high after-market loads are activated while the vehicle is in operation. Recommend installation of a larger battery to replace the unit. Warranty is voided if it is found that after-market loads were installed and caused excessive battery drain during parking. |
| Infrequent Driving | Increase driving frequency and duration. Install a larger battery to replace unit Disconnect the battery during long parking periods if the vehicle is being stored. | Increase driving frequency and duration. Recommend installation of larger battery to replace unit. Recommend disconnection of battery during long parking periods if the vehicle is being stored. |

TABLE 2-continued

| Recommendations associated with Identified Root Causes | | |
| --- | --- | --- |
| Information Request after Battery Issue | | |
| Root Cause | Customer | Service Personnel |
| Primary Power Source Saturation or Issue | Request service personnel to check alternator. Identify and disconnect after-market loads that draw high power while the vehicle is in operation. | Check health of alternator and charging system. Identify and disconnect after-market loads that draw high power while the vehicle is in operation. |

TABLE 3

| Recommendations associated with Identified Root Causes | | |
| --- | --- | --- |
| Message due to Predicted Premature Battery Issue | | |
| Root Cause | Customer | Service Personnel |
| High Key-Off (Parking) Load | Minimize us of vehicle features while vehicle is parked. Disconnect after-market loads that drain the battery while the vehicle is parked. | Minimize use of vehicle features while vehicle is parked. Check for and disconnect after-market loads that drain the battery while the vehicle is parked. The preemptive installation of a larger battery may be suggested to the vehicle owner. |
| High Temperature Operation | Avoid long periods of operation in hot weather conditions. | Avoid long periods of operation in hot weather conditions. Recommend preemptive installation of an AGM or other battery type. Check operation of under-hood fan. |
| High Charge Throughput | Minimize use of vehicle features while vehicle is parked. Disconnect after-market loads that drain the battery while the vehicle is parked. Disconnect after-market loads that draw high power while the vehicle is driving. | Minimize use of vehicle features while vehicle is parked. Check for and disconnect after-market loads that drain the battery while the vehicle is parked. Check for and disconnect after-market loads that draw high power while the vehicle is driving. The preemptive installation of a larger battery may be suggested to the vehicle owner. |
| Infrequent Driving | Increase driving frequency and duration. Disconnect the battery during long parking periods if the vehicle is being stored. | Increase driving frequency and duration. Recommend preemptive installation of larger battery to replace unit. Recommend disconnection of battery during long parking periods if the vehicle is being stored. |
| Primary Power Source Saturation or Issue | Request service personnel to check alternator. Identify and disconnect after-market loads that draw high power while the vehicle is in operation. | Check health of alternator and charging system. Identify and disconnect after-market loads that draw high power while the vehicle is in operation. |

Information Request after Battery Expiration

When a battery expires, the driver or owner may request the root causes via a multifunctional display in the vehicle or via an application running on a mobile phone, tablet, or other device with a connection to the Internet. Maintenance personnel may also request the information using a programmable device that is connected to a diagnostic interface on the vehicle or is connected to the central computing system (cloud) via the Internet. Although the root causes may be especially interesting after battery expiration, they may be requested at any time. If none have been identified, a message stating this or stating that the battery is aging properly may be sent.

Root causes are only identified by the communication strategy if their associated confidence level exceeds a calibrated threshold. Because the early identification of root causes that could lead to battery expiration may also increase expense, it is important that they are only communicated if a high level of confidence. Different thresholds of the confidence levels may be employed for requests from service personnel than from requests from vehicle owners or drivers. This would allow service personnel to have advanced knowledge of possible root causes. The confidence levels corresponding to the root causes that are identified may be communicated to service personnel as well. A customer or owner may not receive this information, or a simple ranking of the root causes with respect to the confidence levels may be communicated to them.

Figure 10:
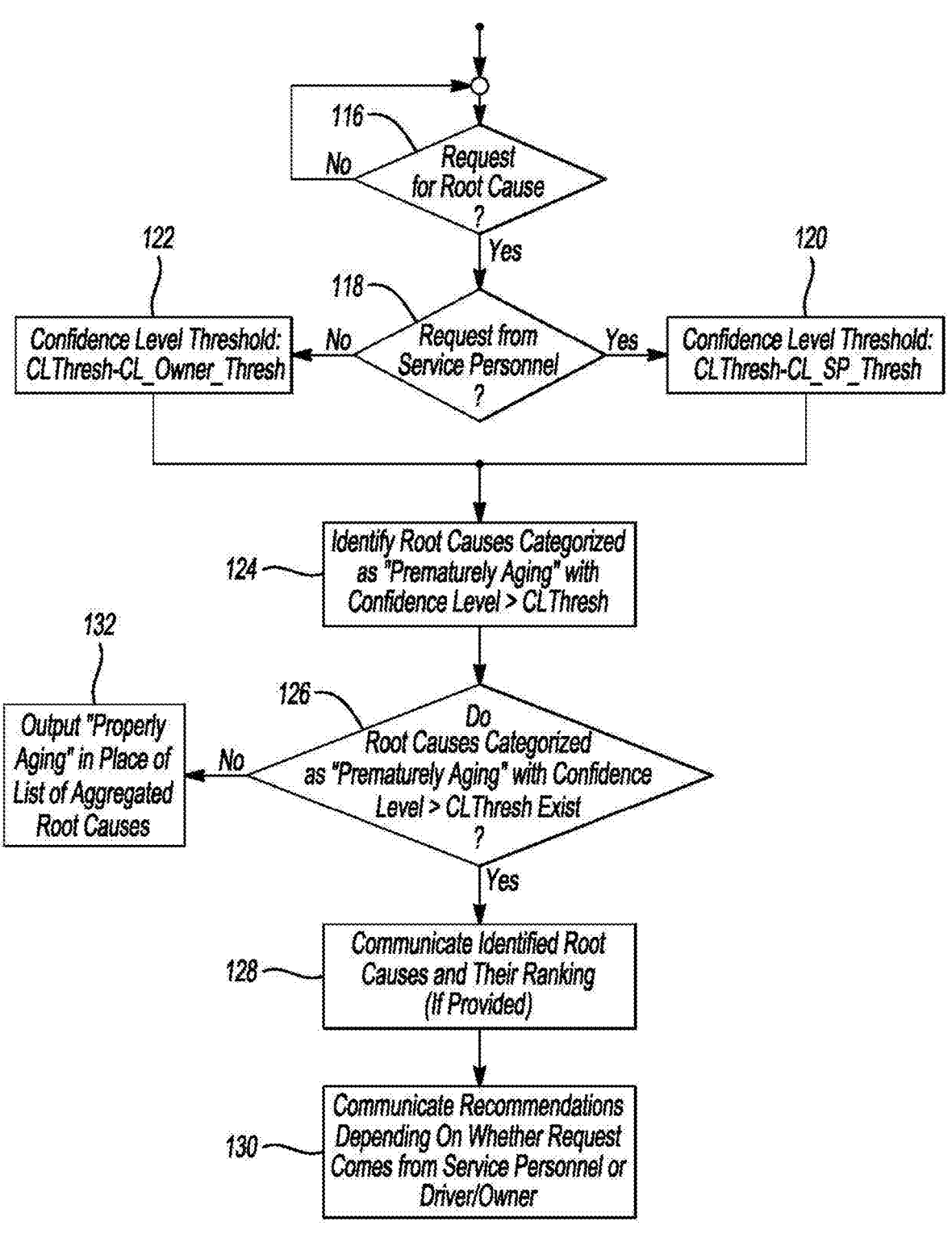
FIG. 10 is a flow chart of a strategy to communicate root causes in response to a request.

The strategy to communicate root causes in response to a request is illustrated in FIG. 10. The calibrated threshold of the confidence level for a request from service personnel is designated as CL_SP_Thresh, while the threshold for a request from the vehicle owner or driver is designated as CL_Owner_Thresh. If a request for root cause is received at operation 116, it is determined whether the request is from service personnel at operation 118. If yes, the confidence level threshold CLThresh is set equal to CL_SP_Thresh at operation 120. Root causes categorized as "Prematurely Aging" with a confidence level greater than CLThresh are then identified at operation 124. If such exist at operation 126, they can be communicated with their ranking (if available) at operation 128. And at operation 130, recommendations can be communicated depending on whether the request is from service personnel or a driver. Returning to operation 126, if such do not exist, the message "Properly Aging" can be output instead of an aggregated list of root causes.

Triggered Communication and Mitigation Based on Root Causes

Communication and/or mitigation may be triggered by metrics of the root causes. Two types of metrics were identified and discussed earlier. The first type consists of measurements that are periodically measured and stored in a buffer. The mean value of the measurements and other statistical information is used for root cause identification. The metrics describing the discharge during the last park phase and discharge during the last drive phase are of this type. The second type consists of measurements that are integrated over the life of the battery. The battery temperature and battery charge current during a drive are both integrated to calculate metrics corresponding to the second type.

Figure 11:
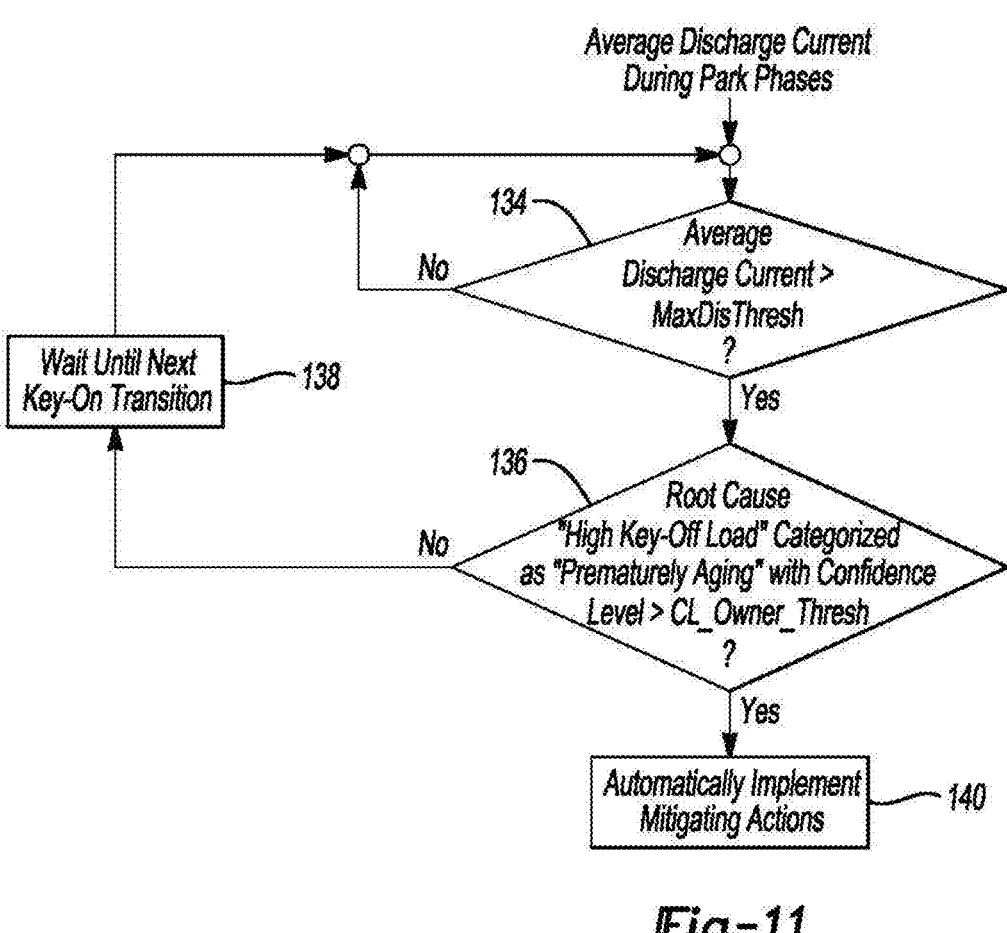
FIG. 11 is a flow chart of an automatic mitigation strategy triggered by an average value of buffered discharge current.

Metrics of the first type may trigger communication and/or mitigation if the mean or peak value of the values in the buffer exceed a threshold and the confidence level of the corresponding root cause exceeds the calibrated communication threshold CL_Owner_Thresh, that may depend on the root cause. An example of the triggered strategy for the first type of metric is illustrated in FIG. 11 for the case where the average discharge current during the last parking phase is compared to a threshold MaxDisThresh. The corresponding root cause is "High Key-Off (Parking) Load."

After operation 134, if the average discharge current exceeds the threshold, it is determined whether the root cause "High-Key-Off (Parking) Load" is categorized as "Prematurely Aging" with a confidence level that exceeds CL_Owner_Thresh in operation 136. If no, the algorithm waits until the next key-on transition at operation 138 before returning to operation 134. If yes, a recommendation associated with the root cause, as defined in Tables 2 and/or 3, may be made via a multi-functional display or by other means. In addition, controllers of the vehicle may prevent activation of vehicle entertainment systems when the vehicle is parked, disconnect after-market loads that draw power while the vehicle is parked, or implement other mitigating actions at operation 140.

Figure 12:
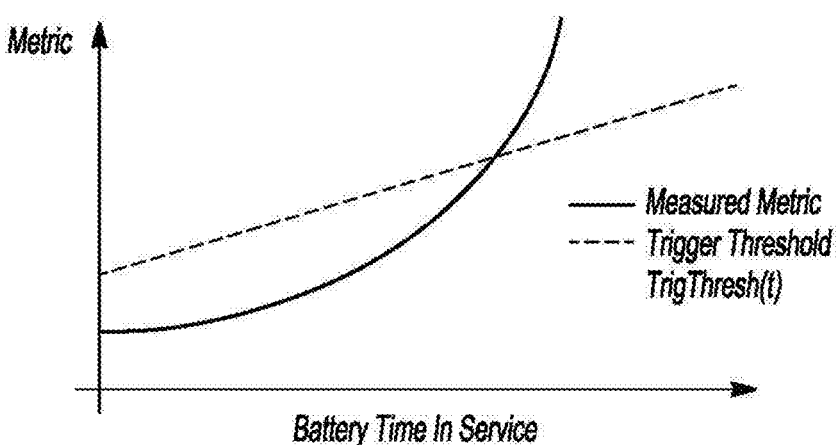
FIG. 12 is a plot of a trigger threshold for metrics consisting of integrated measurements.

Metrics of the second type consist of measurements that are integrated over time. They may trigger communication and/or automatic mitigation measures if their value exceeds a threshold that increases as a function of time, and that is based on the root cause. A generic example of such a threshold is illustrated in FIG. 12. The battery time in service is used as the time parameter for the metric that is compared with the threshold TrigThresh(t).

Figure 13:
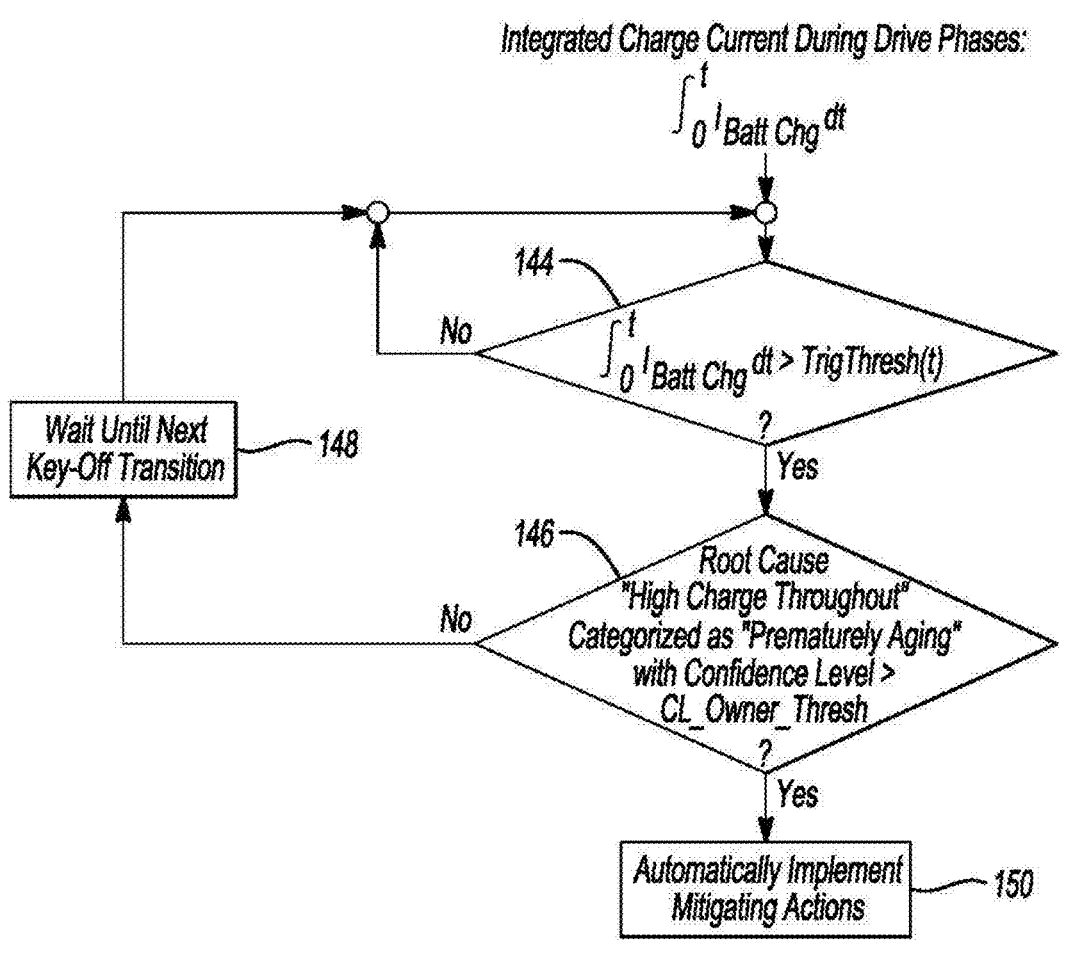
FIG. 13 is a flow chart of an automatic mitigation strategy triggered by a threshold that is a function of time.

An example of the triggered communication and/or mitigation strategy for the second type of metric is illustrated in FIG. 13 for the case where the integrated charge current during concurrent drives is compared to a trigger threshold that is a function of time. The corresponding root cause is "High Charge Throughput."

At operation 144, it is determined whether the integrated charge current during drive phases exceeds TrigThresh(t). If yes, it is determined whether the root cause "High Charge Throughput" is categorized with a confidence level that exceeds CL_Owner_Thresh at operation 146. If no, the algorithm waits until the next key-off transition at operation 148 before returning to operation 144. If yes, a recommendation associated with the root cause, as defined in Tables 2 and/or 3, may be made via a multi-functional display or by other means. In addition, controllers of the vehicle may deactivate aftermarket accessories (upfitter loads), deactivate or limit the activation level (duty cycle) of climate control loads like blowers, deactivate or limit the activation level (duty cycle) of comfort-oriented loads like heated seats, or implement other mitigating actions at operation 150.

Requested Communication from Engineering Personnel

Engineering personnel may also use identified root causes and their confidence levels from a fleet of vehicles to gain insight on why batteries expire prematurely in some vehicles. Root causes may be sent to a data bank including an identification of the vehicle model, and the data bank may be used to make decisions to correct the design of a vehicle's power supply or to guide the development of power supplies in future vehicles. A request for the root causes and confidence levels for a particular vehicle may be made to the central computing system (cloud) where the root cause identification algorithm and the data banks that it uses to make the identification are implemented.

Figure 14:
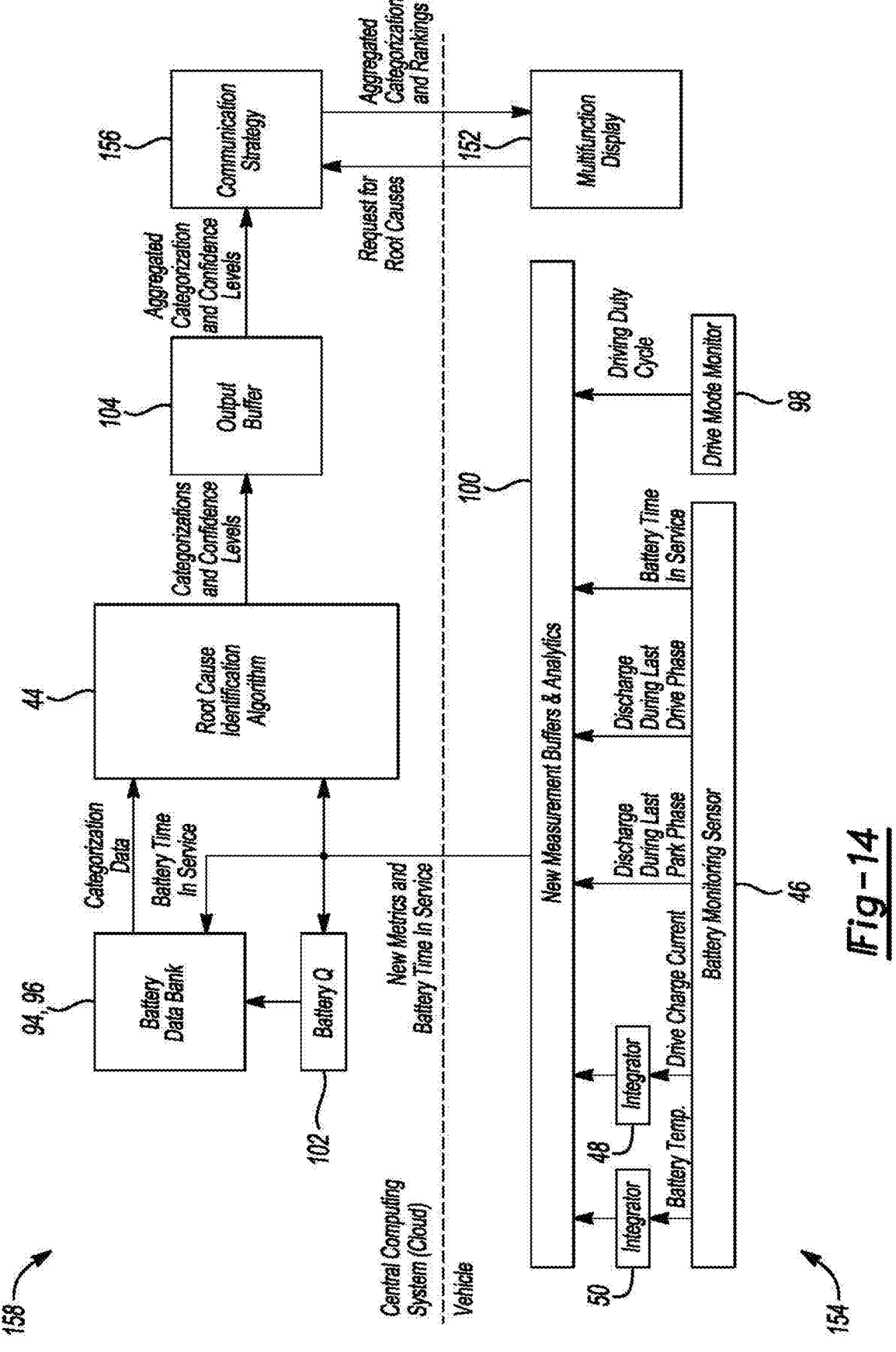
FIG. 14 is a block diagram of the allocation of root cause identification functional elements between a vehicle and central computing system (cloud).
Figure 15:
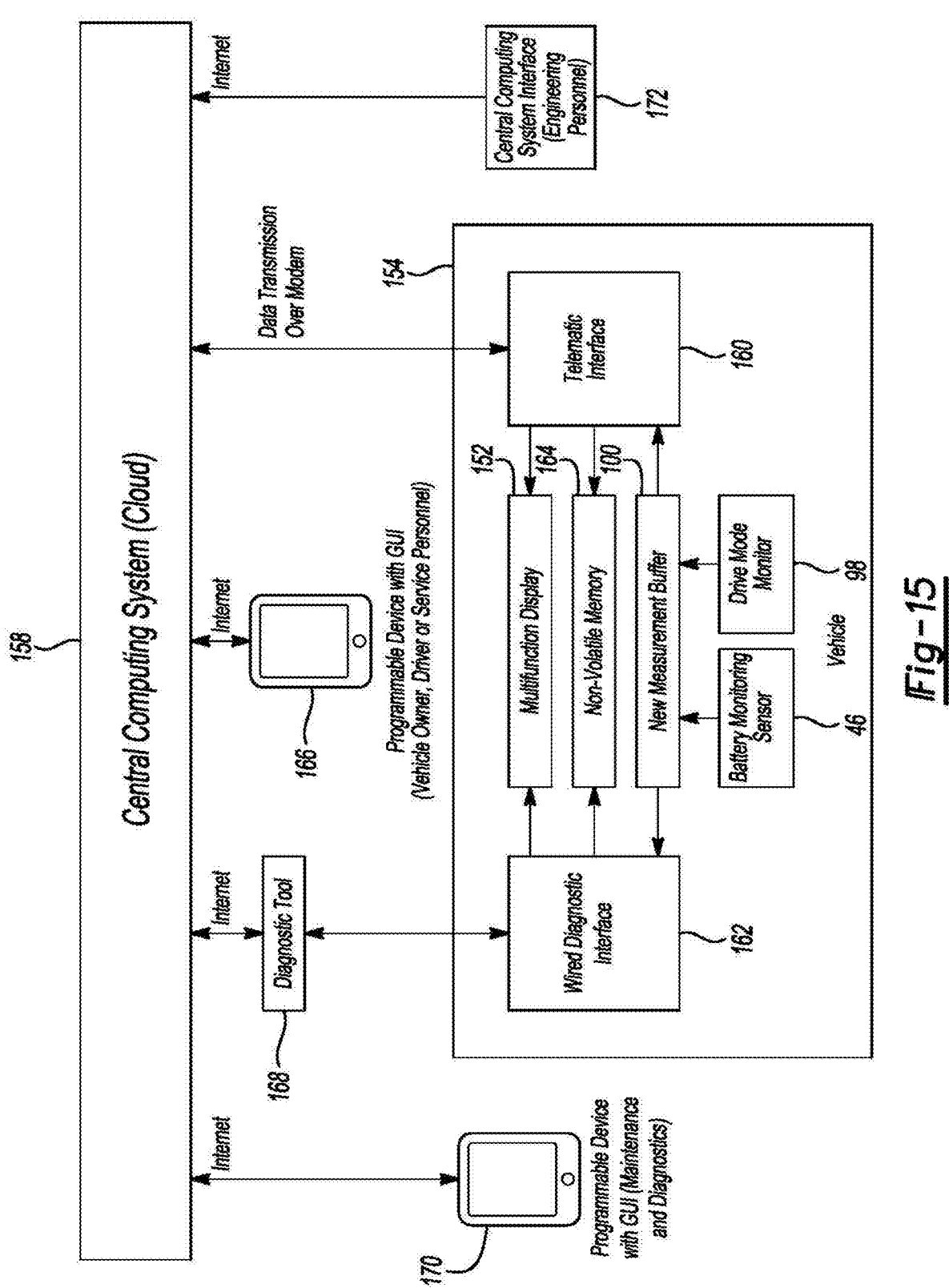
FIG. 15 is a block diagram of interfaces for a root cause identification system.

Infrastructure to Implement Root Cause Identification, Communication, and/or Mitigation Functional Allocation The functional elements of the root cause identification system for battery expiration are distributed between the vehicle and a central computing system (cloud). Data may be transferred between the vehicle and the central computing system via telematics or via a wired diagnostic interface via the Internet. The allocation of the functional elements is illustrated in FIG. 14, in which the battery monitoring sensors 46, integrators 48, 50, drive mode monitor 98, new measurement buffers and analytics 100, and a multifunctional display 152 are components/elements implemented within vehicle 154, and the root cause identification algorithm 44, battery data banks 94, 96, "Battery Q" 102, output buffer 104, and communication strategy 156 are components/elements implemented by central computing system 158.

The "Battery Data Bank" 94, % should receive new categorization data from multiple vehicles and not only the vehicle 154 that is being monitored. It is a central data pool that will ideally grow over time. For this reason, it may be implemented in the central computing system (cloud) 158.

Communication Interfaces and Scenarios

In a preferred implementation of the root cause identification process, battery sensor data and the output of the drive mode monitor 98 are analyzed and buffered on the vehicle 154. The connection between the vehicle 154 and the central computing system (cloud) 158 may be established through telematics 160, or information may be transferred when the vehicle 154 is connected to a wired diagnostic interface 162. If the wired diagnostic interface 162 is used as the connection medium, multiple sets of stored measurement metrics may be transferred at once. The telematic interface 160 and wired diagnostic interface 162 may each communicate with non-volatile memory 164. If a connection using telematics is not provided (for example, because the vehicle 154 is not equipped with a modem), the measurement buffers for new measurements that are illustrated in FIGS. 4 and 8 must be dimensioned large enough to store the set of measurement metrics that are generated between vehicle service appointments.

The vehicle owner or driver may request an identification of root causes at any time through the multifunctional display 152 of through a program on a programmable device such as a mobile phone or tablet 166 with a graphic user interface and a connection to the Internet. The latest assessment of the root causes and associated recommendations are then sent to the onboard vehicle display 152 or to another device that was used to make the request.

Service personnel may request root causes through a diagnostic tool 168 or through a programmable device 170 with a connection to the Internet. Root causes and confidence levels may also be stored in the non-volatile memory 164 in the vehicle 154. The data may be updated each time there is a change in the identified root causes. The data may be read by specialized diagnostic tools.

Engineering personnel may request root causes and the corresponding confidence levels from a specific vehicle via a central computing system interface 172. They would also have access to the battery data banks in order to assess the root causes of battery expirations in large sets of production vehicles. This information may be used to improve the design of vehicle power supplies. The information may be particularly useful for choosing battery sizes and types on a given vehicle to improve the life expectancy of the low-voltage (12V) battery and to minimize its associated expense.

The strategies proposed here may identify the root causes of a battery expiration that may be used after a 12V lead-acid battery expires or before the expiration occurs to increase the life expectancy of installed or future replacement batteries or prevent an unexpected vehicle breakdown.

The method collects measurements of battery metrics and identifies root causes based on the similarity of the measurements to those of batteries that were known to age prematurely and expire due to a known set of root causes. The measurement metrics are chosen for their known correlation to battery health and aging. However, the measurements are not necessarily used to model the electrical behavior of the battery.

Measured metrics for other battery chemistries and types may be monitored as well in the same way in order to identify root causes. While some metrics such as charge throughput may be used to identify root causes for several battery chemistries, other battery types may require new metrics to be created. The method described here provides a general framework that may be expanded to monitor other battery types.

Furthermore, the scope may be expanded to include batteries implemented in aircraft, ships and stationary power supplies (for example domestic power supplies) that use lead-acid and other battery chemistries batteries for energy storage. Domestic stationary power supplies that are supplied by solar cells and wind turbines often use large banks of lead-acid batteries and other battery types for energy storage, and premature expiration of individual batteries is a technical problem with economic implications that may be addressed.

Many 12V battery issues may be linked excessive key-off loads. The definition of this condition is that the average battery discharge current during parking exceeds the maximum defined threshold at which the targeted battery life expectancy can be guaranteed. That threshold is dependent on the battery size and type (flooded, advanced flooded or AGM). A battery is chosen for a vehicle based on measurements of key-off loads when all vehicle systems are in their lowest power-drawing state and on assumptions of customer interaction with the vehicle while it is parked and the associated current that is drawn as a consequence of the interaction.

Despite efforts to correctly characterize parking loads and to choose a suitable battery, vehicles may experience average discharge currents during parking that exceed the estimates and the maximum value for the installed battery. There are three reasons for this: (1) A driver or passenger activates loads at a frequency or with a duration that exceeds the assumptions used to calculate the average discharge current. (2) Modules do not remain at their lowest power-drawing states and draw more current than assumed due to software errors or system architecture. The root cause may be that the software in one module keeps it and other modules on a common CAN bus awake at elevated power consumption levels. (3) A customer or third-party vender installs aftermarket equipment in the vehicle that draws power while the vehicle is parked. Examples of such equipment are refrigerators and telematic equipment.

The root cause identification framework defined above may thus be expanded to distinguish between customer interaction, system-software issues, or aftermarket equipment as the cause for excessive discharge current. In order to do so, new metrics are required. As described above, more features and their corresponding metrics may be added to the framework. In the paradigm of artificial intelligence, root causes are "Features" that are identified via metrics. Depending on the type of root cause that is being identified, the new metrics either count activations or calculate elapsed actuation time over a defined time interval.

The new metrics define new characteristics of battery expirations due to excessive discharge current. In order to process them, the root cause identification algorithm described above may be expanded to carry out multivariate identification for more than a single variable (metric). The combination of new metrics and the expanded identification algorithm may be used to distinguish between specific causes of excessive battery discharge current.

Metrics to Identify Causes of Excessive Battery Discharge Current

In Table 1, metrics are defined to identify root causes. Each metric corresponds to a separate root cause. One of those root causes is "High Key-Off Load," and its metric is the integral of load current over time in parking phases. In order to distinguish between causes of the excessive key-off load, it is necessary to add additional metrics. The metrics monitor the actuation of specific loads, and the information from them is correlated with the original high-current metric. An enhanced multivariate root cause identification algorithm processes the correlated metrics in order to determine whether that load is responsible for the excessive current draw.

Metrics to Identify Excessive Discharge Current Due to Customer Interaction

Two types of metrics are defined. Their type depends on the characteristics of the vehicle features that they monitor.

Measuring Customer Interaction Through Activation Count

Some vehicle features cause activation of loads for durations that are not dependent on customer interaction. The vehicle feature "Phone as a Key" (PaaK) is an example of this. The duration of the actuation of a solenoid to unlock or lock a vehicle as well as the activation durations of the associated communication and control modules is not dependent on the customer or how he interacts with his phone. Once the customer requests the vehicle to be unlocked with his phone, a sequence of events occur with durations that may only be dependent on internal vehicle states and do not vary significantly.

For this type of vehicle feature, each actuation is counted, and the running total is stored in non-volatile memory. The running total may also be referred to as the elapsed activation count. The actuation counter may be a part of the controls for that specific vehicle feature that reside in the vehicle.

As described above, data from each metric is measured over time and assigned to a time interval corresponding to the battery time in service. Once a new time interval begins, the data stored in non-volatile memory or statistical metrics describing the data is stored in a data bank corresponding to the last time interval. Then, the non-volatile memory is cleared and compilation of data for the next time interval begins.

Measuring Customer Interaction Through Activation Time

Some vehicle features may cause activation of loads for durations that are dependent on customer interaction. An example of this may be a vehicle feature that allows a customer to activate on-board cameras using a phone and to view the vehicle's interior or surroundings. (This feature will be referred to as "Camera Monitoring" below.) The impact of such a vehicle feature on the discharge of the battery is best determined by recording the actuation time of each customer interaction and calculating the elapsed activation time in a defined time interval. The actuation timer may be a part of the controls for that specific vehicle feature that reside in the vehicle. An implementation is illustrated in FIG. 16. Time is the value of a clock tracking real time. The variable ElapsedActivationTime represents the calculated elapsed activation time in a defined time interval. It should be stored in non-volatile memory. Once a new time interval begins, the elapsed time stored in non-volatile memory is stored in a data bank corresponding to the last time interval. Then, the non-volatile memory is cleared and compilation of data for the next time interval begins.

At operation 174, with activation of a vehicle feature, StartTime is set equal to Time. Then, at operation 176, if the vehicle feature ends, ElapsedActivationTime is set equal to the expressions shown.

Impact of Over-the-Air Updates on Battery Life

An over-the-air update is similar to a customer interaction with an undefined duration. It may have a maximum duration defined by a requirement, but the activation time of modules in the vehicle may vary within that time or even exceed it depending on the time required for them to go to a low-power state. For this reason, elapsed actuation time is used as a metric to measure the impact of an update on battery life. As will be discussed below, that information will be cross-referenced with the measured battery discharge current during parking phases.

Integration of Customer Interaction Metrics into Identification Process

Elapsed activation-count and elapsed activation-time metrics can thus be added as inputs to the root cause identification process of FIG. 4. They can be used to determine whether vehicle features such as PaaK. camera monitoring or an over-the-air update are responsible for high key-off load.

Metric to Identify Excessive Discharge Current Due to System-Software Issues

While the vehicle is parked in a torque-not-available condition, modules may not remain at their lowest power-drawing states and draw excess current due to software errors or system architecture. The root cause may be that software in one module keeps other modules on a common CAN bus awake. It may also be that a single module is kept in a high power-consumption state due to an unexpected sensor input or software problem.

In order to correlate excessive current draw with modules or systems, it is necessary to log elapsed activation time of key modules. Modules may be chosen for monitoring based on their connection with a CAN network. They may be also chosen based on their complexity or on other factors that may make them susceptible to software or design errors. FIGS. 17A and 17B illustrate a possible implementation of the elapsed activation timer for a given module. It is assumed that the processes illustrated in the figures run in the module that is being monitored.

The process that is illustrated in FIG. 17A has the task of periodically writing new time stamps in non-volatile memory as long as the module is not in a low-power consumption state. The process is triggered when the vehicle experiences a key-off transition to a torque-not-available mode. It is assumed that the process runs independently of other software processes that run in the module and that it will end when the other processes are finished and the module is ready to go into a low-power mode. Once the process is triggered, it waits a calibrated amount of time (TKeyOff) at operation 178. If the module is still active after TKeyOff the current time is assigned to the variables Start-Time and MonitorTime at operation 180, which are stored in non-volatile memory. Next, the value of the variable Time-Stamp is assigned the current time at operation 182. Once the current time exceeds the sum of the time stamp and a calibrated value (MonitorPeriod) at operation 184, the current time is assigned to the variable MonitorTime in non-volatile memory at operation 186.

The process that is illustrated in FIG. 17B has the task of calculating the module's activation time during the last key-off interval and updating the corresponding elapsed time.

The process is triggered when the vehicle experiences a key-on transition to a torque-available mode. The activation time during the last parking phase is calculated from the difference between the variables MonitorTime and Stop-Time at operation 188. Both are stored in non-volatile memory, and the variable MonitorTime is updated periodically until the module goes to a low power consumption state (if at all) during the last parking phase. The elapsed activation time for the module is also stored in non-volatile memory. Once the last activation time is calculated, the value of the elapsed activation time is incremented by its value.

The variable ElapsedActivationTime represents the calculated elapsed activation time in a defined time interval. Once a new time interval begins, the elapsed time stored in non-volatile memory is stored in a data bank corresponding to the last time interval. Then, the non-volatile memory is cleared and compilation of data for the next time interval begins.

Root Cause Identification Algorithm

Identification of Customer Interaction or System-Software Issues as Root Cause

The root cause identification algorithm that was described above uses information from a single metric to identify a corresponding root cause. It compares data collected over a defined time interval to data that belongs to batteries that expired prematurely and to data from batteries that expired after the minimum life expectancy target to determine which group is more similar to the monitored battery. This widens the scope by describing how the root cause identification framework defined there may be modified to distinguish between high key-off loads due to "customer interaction," "system-software related issues," and "aftermarket accessories." This is done using the correlation of the metrics corresponding to high key-off loads and the metrics corresponding to the cause of the high key-off loads. As described above, they describe either the elapsed actuation count or elapsed actuation time of a root cause in a time interval. The correlation describes the distribution of metrics describing both discharge current and the level of actuation (count or elapsed time) of monitored vehicle features or loads (control modules). A distribution or process with multiple random variables is "multivariate." An example of a multivariate distribution with elapsed actuation count as a metric to capture customer interaction is illustrated in FIG. 18.

Figure 18:
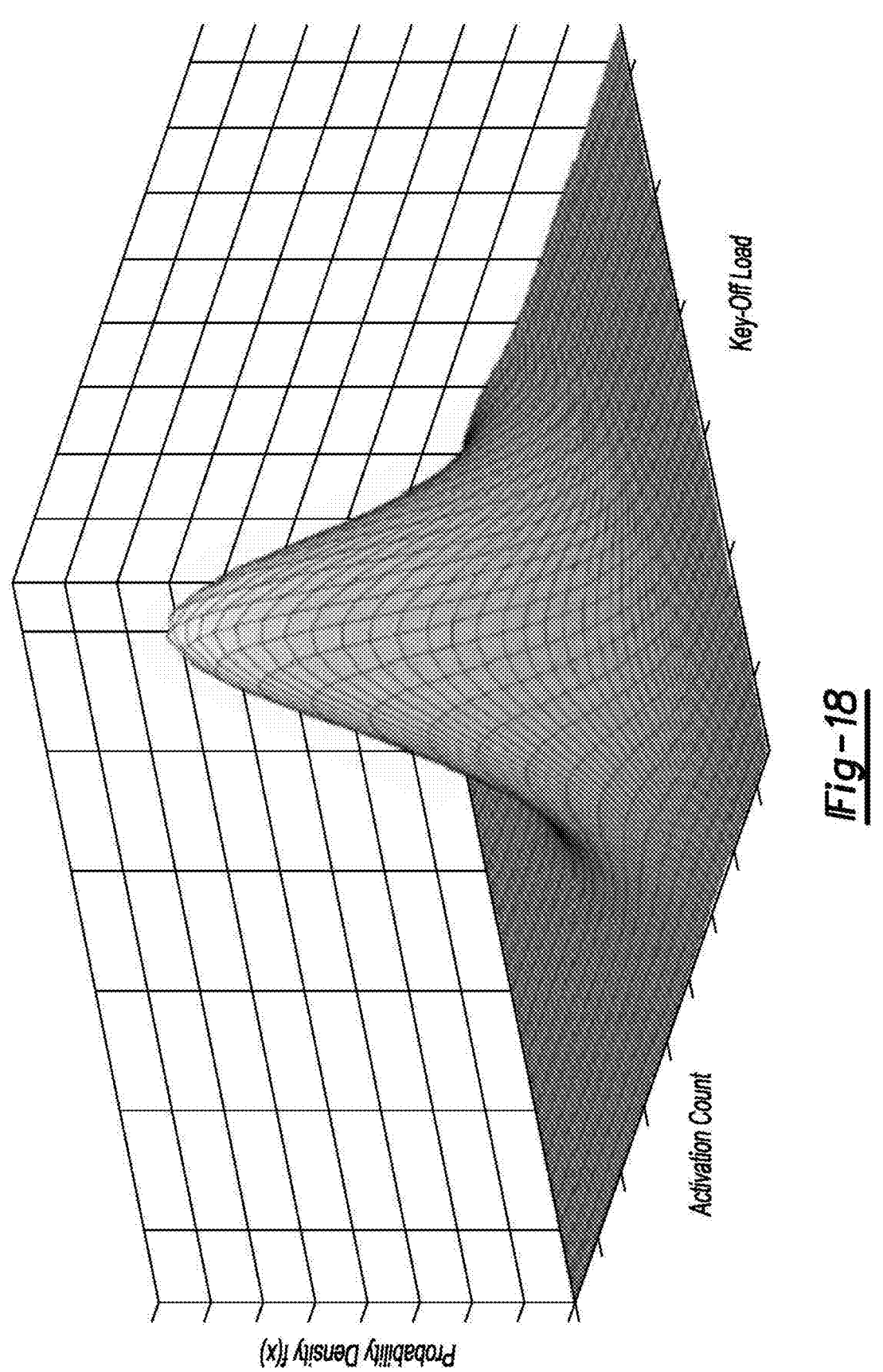
FIG. 18 is a plot of correlated distribution of discharge current and actuation count in a defined time interval.

FIG. 18 illustrates a bivariate distribution that is characterized by a two-dimensional mean value vector $\mu^{1\times2}$ and $(2\times2)$ dimensional covariance matrix $\Sigma^{2\times2}$. The statistical characteristics of distributions corresponding to batteries that expire prematurely and batteries that expire after their targeted minimum life expectancy are collected in a data bank as described above. In order to realize the enhanced multivariate identification algorithm, the mean vector and covariance matrixes are stored in the data bank.

The root cause identification algorithm is based on a supervised-learning method that compares metrics that correspond to root causes from a given vehicle with the metrics corresponding to vehicles with batteries that expired either prematurely or properly (after the life expectancy target). The algorithm compares the metrics that are measured that correspond to root causes with the same metrics corresponding to a large set of vehicles with batteries that expired prematurely or properly. The statistical parameters of the large data sets of metrics include the mean value vectors, covariance matrices and probability density functions. They are used by the identification algorithm to carry out the comparison. Root cause or causes that are most similar to the measured metrics are identified by the algorithm. If the measured metrics are most similar to those of a battery that is aging properly, no root cause but a properly aging battery is identified.

The difference between the enhanced algorithm described here and the one described earlier is that the enhanced algorithm processes multi-dimensional (bivariate) distributions. Theoretically, distributions describing the correlations between more than two metrics may be processed as well.

Figure 19:
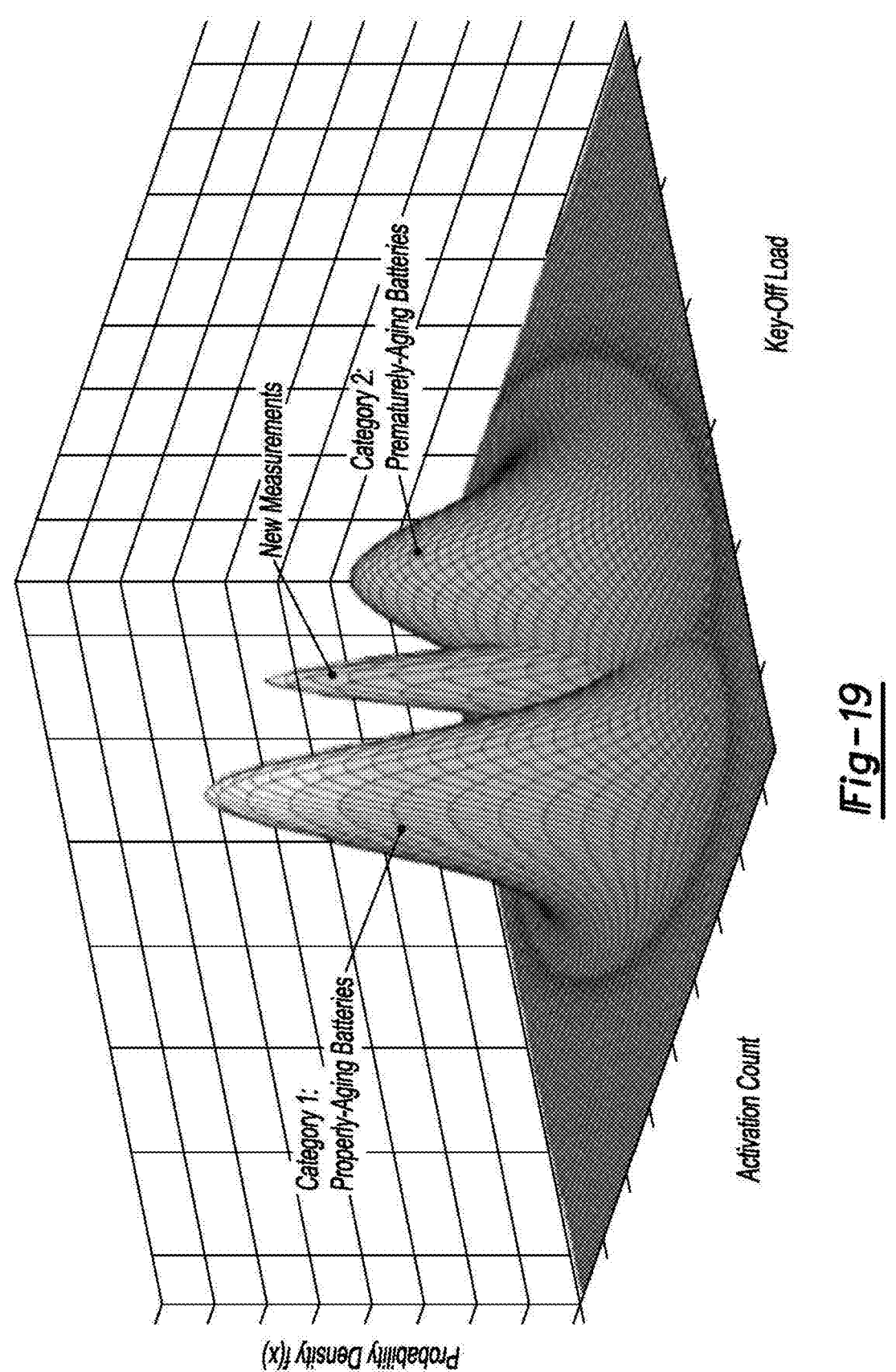
FIG. 19 is a plot of measurement data from a monitored battery with data from two established categories.

FIG. 19 illustrates distributions of measured data characterizing customer usage and categorized data stored in the supervised-learning data bank. The identification algorithm decides whether the new measurements are more similar to "Category 1" or "Category 2" based on the statistical characteristics of the three distributions.

The similarity of the measured data to the two categories corresponding to properly aging and prematurely aging batteries is determined by the linear discriminant analysis process that was referenced above. It may be implemented to carry out comparisons of distributions with single or multiple variables.

As in the case with a single variable, multivariate linear discriminant analysis calculates a confidence level associated with its similarity identification. That may be used by the communication strategy described above.

Both the single variable linear discriminant process that was described earlier and the bivariate version described here can be implemented in the root cause identification algorithm described above. The single variable process is required to identify the root causes "High Temperature Operation," "High Charge Throughput," "Infrequent Driving," "Primary Power Source Issue," and "High Key-Off Load," The bivariate process is used to identify causes for a "High Key-Off Load." Those causes may be frequent activation of specific vehicle features during parking or a system-software issue.

Identification of Aftermarket Accessories as Cause of Battery Discharge

Aftermarket accessories (upfitter loads) are generally not designed with the ability to measure and report activation frequency and duration. They may be identified as potential causes of excessive battery discharge if high key-off load is identified, but no specific cause ("customer interaction" or "system-software related issues") is identified within the framework described here. The identification of aftermarket accessories as a cause becomes more accurate as more modules are monitored for system or software issues.

Figure 20:
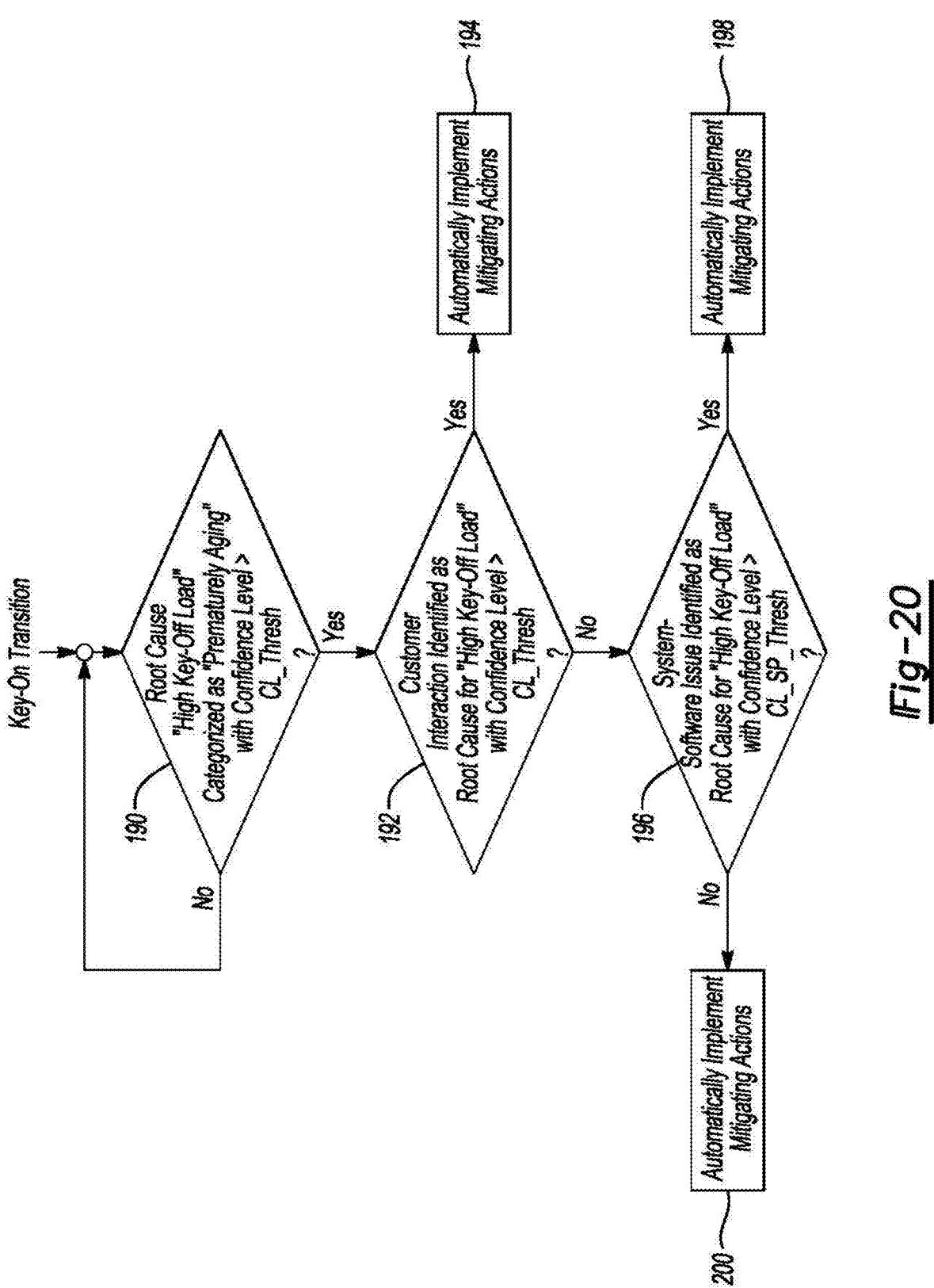
FIG. 20 is a flow chart of a process to identify high key-off loads as a root cause of battery expiration.

FIG. 20 illustrates using the outputs of the single variable linear discriminant identification process and the output of the bivariate version to identify the root cause "High Key-Off Load" with a recommendations or automatic mitigating actions. It also illustrates how the strategy is triggered if customer interaction is identified as the cause of excessive battery drain. If the confidence level of the identification exceeds the calibrated threshold CL_Thresh, certain actions are triggered.

If a system-software issue is identified as the cause of excessive battery drain, the strategy will again be triggered. Modules that have been identified as having high elapsed activation times may be reported to service personnel, however the customer or driver would not be notified.

At operation 190, if the root cause "High Key-Off Load" is categorized as "Prematurely Aging" with a Confidence Level greater than CL_Thresh, a recommendation associated with the root cause, as defined in Tables 2 and/or 3, may be made via a multi-functional display or by other means. Then it is checked in operation 192 whether "Customer Interaction" is the root cause of "High Key-Off Load" with a confidence level greater than CL_Thresh. If it is found in operation 192 that "Customer Interaction" is the root cause with a confidence level greater than CL_Thresh, then features that are requested for operation by the customer while the vehicle is parked may not be activated. These loads may include entertainment systems such as a radio, climate control systems that require battery power to run blowers and comfort-orientated systems such as heated seats. Operation 194 represents the set of all features that are blocked in order to mitigate "High Key-Off Load" due to "Customer Interaction."

Returning to operation 192, if "Customer Interaction" is not identified as the root cause of "High Key-Off Load," it is checked in operation 196 whether a "System Software Issue" is the root cause of the "High Key-Off Load" with a confidence level that is greater than CL_SP_Thresh. If yes, "System Software Issue" is the root cause of the "High Key-Off Load" with a confidence level that is greater than CL_SP_Thresh, mitigating actions associated with operation 198 may be triggered. The mitigating actions may include rolling back the software version of modules if an over-the-air update occurred within a predefined time span, cancellation of customer requests for activation of the radio, interior cabin blowers and/or heated seats, representing entertainment, climate-control and comfort-oriented systems, and disconnecting of power to modules that are kept activated at a low power state while the vehicle is parked. In addition, a message may be sent to the vehicle manufacturer that a system software issue causing excessive key-off load has been identified.

If the comparison in operation 196 yields a no, it may be assumed that the "High Key-Off Loads" are caused by aftermarket accessories (upfitter loads). If the comparison in operation 196 yields a no, mitigating actions associated with operation 200 may be triggered. The mitigating actions include deactivation of all controllable aftermarket accessories during parking. Such aftermarket loads may include video monitoring and telecommunication equipment. Mitigating actions may also include cancellation of customer requests for activation of the radio, interior cabin blowers and heated seats, representing entertainment, climate-control and comfort-oriented systems if the total nominal or measured current that is used by the loads that are incorporated by the features exceeds a predefined value.

Figure 21:
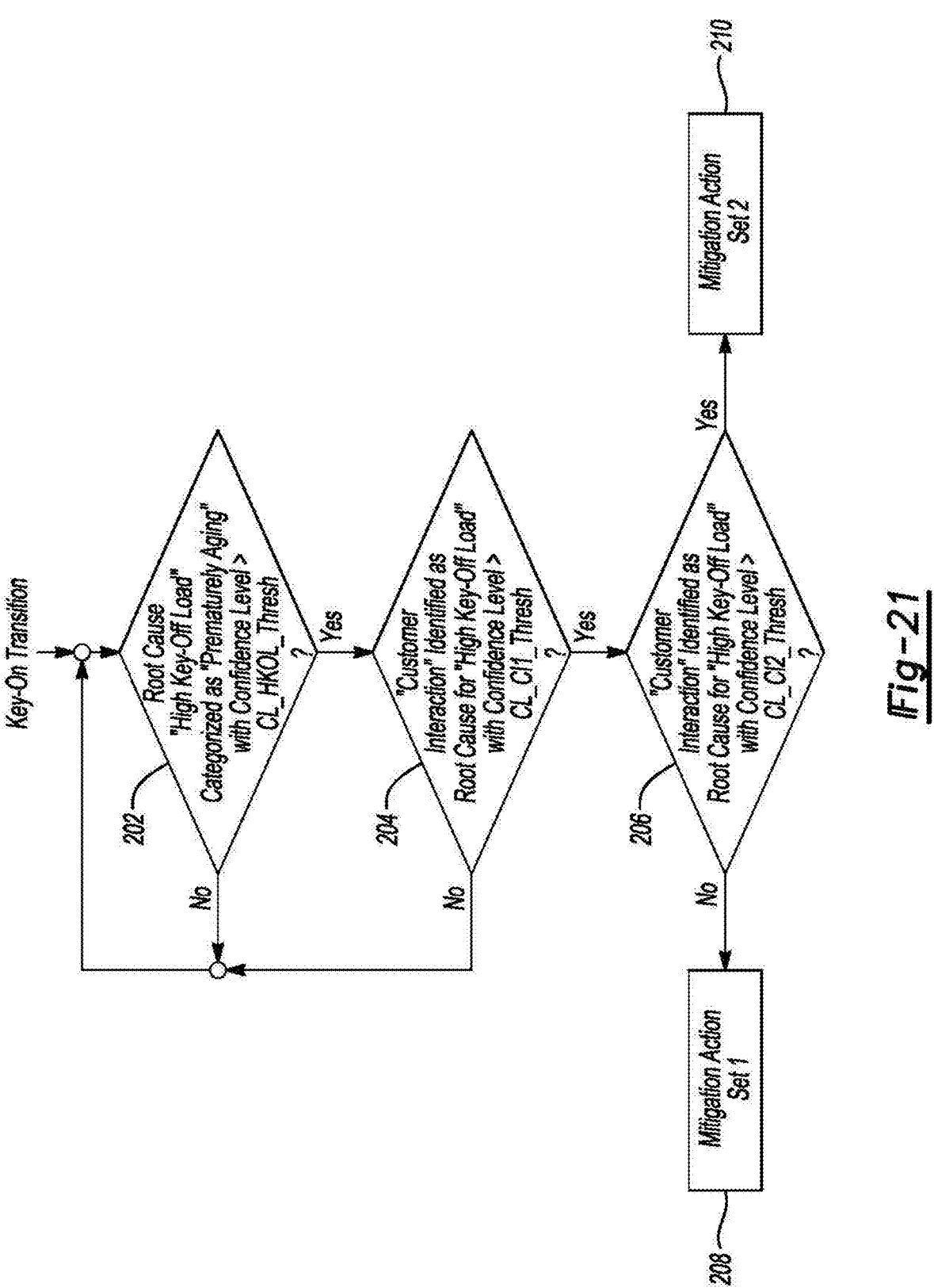
FIG. 21 is a flow chart of a process to manage customer interaction as a function of confidence level of identification as root cause.

Managing Customer Interaction as a Function of Confidence Level of Identification as Root Cause FIG. 21 illustrates using the outputs of the single variable linear discriminant identification process to trigger automatic mitigating actions if customer interaction is identified as the cause of excessive battery drain. In this case, the set of mitigation actions that are implemented depends on the magnitude of the confidence level of the identification of customer interaction as the root cause.

At operation 202, if the root cause "High Key-Off Load" is categorized as "Prematurely Aging" with a Confidence Level greater than CL_Thresh, a recommendation associated with the root cause, as defined in Tables 2 and/or 3, may be made via a multi-functional display or by other means. Then it is checked at operation 204 whether "Customer Interaction" is the root cause of "High Key-Off Load" with a confidence level greater than CL_CI1_Thresh. If yes, then it is checked at operation 206 whether "Customer Interaction" is the root cause of "High Key-Off Load" with a confidence level greater than CL_CI2_Thresh, where CL_CI1_Thresh<CL_CI2_Thresh.

If it is found at operation 204 that "Customer Interaction" is the root cause of "High Key-Off Load" with a confidence level greater than CL_CI1_Thresh, but it is found at operation 206 that the confidence level of the identification is less than CL_CI2_Thresh, Mitigation Action Set 1 corresponding to operation 208 is implemented. Mitigation Action Set 1 may consist of cancellation of customer requests for activation during parking of the radio, interior cabin blowers and heated seats, representing entertainment, climate-control and comfort-oriented systems if the total nominal or measured current that is used by the loads that are incorporated by the features exceeds a predefined value. It may also consist of deactivating at least one electronic control unit of the vehicle, dimming interior lighting of the vehicle, and/or reducing maximum power provided to heating elements for seats or to fans.

If it is found at operation 204 that "Customer Interaction" is the root cause of "High Key-Off Load" with a confidence level greater than CL_CI1_Thresh, and it is found at operation 206 that the confidence level of the identification is greater than CL_CI2_Thresh, Mitigation Action Set 2 corresponding to operation 210 is implemented. Mitigation Action Set 2 may consist of cancellation of all customer requests for activation of features during parking. Cancelled features may include the radio, interior cabin blowers, heated seats and/or interior lighting, representing entertainment, climate-control and comfort-oriented systems, as well as camera-based security systems. If an additional, still higher threshold is also implemented in a similar fashion (e.g., CL_CI3_Thresh>CL_CI2_Thresh), corresponding mitigating actions (e.g., Mitigation Action Set 3) may include preventing power flow to at least one auxiliary power outlet of the vehicle and/or preventing power flow to snowplow equipment, refrigeration equipment, or at least one pump of the vehicle. These mitigating actions may also be used in scenarios with only two thresholds. For example, preventing power flow to at least one auxiliary power outlet of the vehicle may be considered a member of Mitigation Action Set 1. Preventing power flow to snowplow equipment of the vehicle and/or preventing power flow to at least one pump of the vehicle may be considered a member of Mitigation Action Set 2. Mitigation Action Set 3 may also include deactivating at least one electronic control unit of the vehicle, dimming interior lighting of the vehicle, reducing a maximum power provided to heating elements for seats of the vehicle, and/or reducing a maximum power provided to fans of the vehicle. That is, any of the above (or other) mitigating actions may be included in any of Mitigation Action Sets 1, 2, and/or 3 (if applicable) as configuration strategies dictate.

Messaging and Actions for High Key-Off Current Due to Aftermarket Accessories

Excessive key-off load may be identified as a root cause for premature battery expiration using the corresponding metric and identification algorithm described above. If this occurs, and no customer-interaction or system-software causes for the excess current are identified, the customer and service personnel may receive a recommendation to search for and disconnect any aftermarket accessories that are present. It may be also recommended to install a larger battery.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure. The words processor and processors may be interchanged herein, as may the words controller and controllers.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A control arrangement for a vehicle comprising:
a controller programmed to, while the vehicle is parked and
  responsive to data being indicative of key-off loads exceeding a load threshold with a confidence that exceeds a first confidence threshold, deactivate at least one electronic control unit of the vehicle, and
  responsive to data being indicative of key-off loads exceeding the load threshold with a confidence that exceeds a second confidence threshold greater than the first confidence threshold, prevent user activation of an entertainment system of the vehicle.

2. The control arrangement of claim 1, wherein the controller is further programmed to, responsive to the data being indicative of key-off loads exceeding the load threshold with the confidence that exceeds the second confidence threshold, prevent user activation of heating elements for seats of the vehicle.

3. The control arrangement of claim 1, wherein the controller is further programmed to, responsive to the data being indicative of key-off loads exceeding the load threshold with the confidence that exceeds the second confidence threshold, prevent user activation of lighting of the vehicle.

4. The control arrangement of claim 3, wherein the lighting is interior lighting.

5. The control arrangement of claim 1, wherein the controller is further programmed to, responsive to the data being indicative of key-off loads exceeding the load threshold with the confidence that exceeds the first confidence threshold, dim interior lighting of the vehicle.

6. The control arrangement of claim 1, wherein the controller is further programmed to, responsive to the data being indicative of key-off loads exceeding the load threshold with the confidence that exceeds the first confidence threshold, reduce a maximum power provided to heating elements for seats of the vehicle.

7. The control arrangement of claim 1, wherein the controller is further programmed to, responsive to the data being indicative of key-off loads exceeding the load threshold with the confidence that exceeds the first confidence threshold, reduce a maximum power provided to fans of the vehicle.

8. The control arrangement of claim 1, wherein the controller is further programmed to, responsive to the data being indicative of key-off loads exceeding the load threshold with the confidence that exceeds the first confidence threshold, command another of the at least one electronic control units to revert to a previous software version.

9. The control arrangement of claim 1, wherein the controller is further programmed to, responsive to data being indicative of key-on loads exceeding another load threshold with a confidence that exceeds a third confidence threshold, prevent power flow to at least one auxiliary power outlet of the vehicle.

10. The control arrangement of claim 1, wherein the controller is further programmed to, responsive to data being indicative of key-on loads exceeding another load threshold with a confidence that exceeds a third confidence threshold, prevent power flow to snowplow equipment, refrigeration equipment, or at least one pump of the vehicle.

11. A method for a vehicle, comprising:
after receiving data indicating key-on loads exceed a load threshold with a confidence that exceeds a first confidence threshold, preventing power flow to at least one auxiliary power outlet of the vehicle; and
after receiving data indicating key-on loads exceed a load threshold with a confidence that exceeds a second confidence threshold greater than the first confidence threshold, preventing power flow to snowplow equipment of the vehicle.

12. The method of claim 11 further comprising, after receiving the data indicating key-on loads exceed the load threshold with the confidence that exceeds the second confidence threshold, preventing power flow to refrigeration equipment of the vehicle.

13. The method of claim 11 further comprising, after receiving the data indicating key-on loads exceed the load threshold with the confidence that exceeds the second confidence threshold, preventing power flow to at least one pump of the vehicle.

14. The method of claim 11 further comprising, after receiving data indicating key-off loads exceed another load threshold with a confidence that exceeds a third confidence threshold, deactivating at least one electronic control unit of the vehicle, dimming interior lighting of the vehicle, reducing a maximum power provided to heating elements for seats of the vehicle, or reducing a maximum power provided to fans of the vehicle.

15. The method of claim 11 further comprising, after receiving data indicating key-off loads exceed another load threshold with a confidence that exceeds a third confidence threshold, deactivating at least one electronic control unit of the vehicle, preventing user activation of an entertainment system of the vehicle, preventing user activation of heating elements for seats of the vehicle, or preventing user activation of lighting of the vehicle.

16. A vehicle comprising:
a battery; and
a controller programmed to
  responsive to data being indicative of key-off loads exceeding a load threshold with a confidence that exceeds a first confidence threshold, deactivate at least one electronic control unit of the vehicle, and
  responsive to data being indicative of key-on loads exceeding another load threshold with a confidence that exceeds a second confidence threshold, dim interior lighting of the vehicle.

17. The vehicle of claim 16, wherein the controller is further programmed to, responsive to the data being indicative of key-off loads exceeding the load threshold with a confidence that exceeds a third confidence threshold greater than the first confidence threshold, prevent user activation of an entertainment system of the vehicle.

18. The vehicle of claim 16, wherein the controller is further programmed to, responsive to the data being indicative of key-off loads exceeding the load threshold with a confidence that exceeds a third confidence threshold greater than the first confidence threshold, prevent user activation of heating elements for seats of the vehicle.

19. The vehicle of claim 16, wherein the controller is further programmed to, responsive to the data being indicative of key-on loads exceeding the another load threshold with a confidence that exceeds a third confidence threshold greater than the second confidence threshold, prevent power flow to snowplow equipment of the vehicle.

20. The vehicle of claim 16, wherein the controller is further programmed to, responsive to the data being indicative of key-on loads exceeding the another load threshold with a confidence that exceeds a third confidence threshold greater than the second confidence threshold, prevent power flow to refrigeration equipment of the vehicle.

\* \* \* \* \*